(12) United States Patent
Ahn et al.

(10) Patent No.: US 11,201,592 B2
(45) Date of Patent: Dec. 14, 2021

(54) DOHERTY COMBINER

(71) Applicant: SOONCHUNHYANG UNIVERSITY INDUSTRY ACADEMY COOPERATION FOUNDATION, Asan (KR)

(72) Inventors: Dal Ahn, Cheonan (KR); Kwan-Sun Choi, Seoul (KR); Jong-Sik Lim, Daejeon (KR); Sang-Min Han, Suwon (KR); Sung-Min Kim, Yongin (KR); You-Na Jang, Asan (KR); Dae-Ung Lee, Gwangyang (KR); Jun-Seok Oh, Incheon (KR); Seo Koo, Asan (KR); Tae-Hoon Kang, Bucheon (KR); Ji-Won Kim, Pyeongtaek (KR); Ik-Soo Jang, Seongnam (KR)

(73) Assignee: SOONCHUNHYANG UNIVERSITY INDUSTRY ACADEMY COOPERATION FOUNDATION, Asan (KR)

( * ) Notice: Subject to any disclaimer, the term of this patent is extended or adjusted under 35 U.S.C. 154(b) by 0 days.

(21) Appl. No.: 16/641,214

(22) PCT Filed: Oct. 23, 2017

(86) PCT No.: PCT/KR2017/011732
§ 371 (c)(1),
(2) Date: Feb. 21, 2020

(87) PCT Pub. No.: WO2019/039650
PCT Pub. Date: Feb. 28, 2019

(65) Prior Publication Data
US 2020/0228065 A1 Jul. 16, 2020

(30) Foreign Application Priority Data
Aug. 23, 2017 (KR) .......................... 10-2017-0106729

(51) Int. Cl.
*H03F 1/02* (2006.01)
*H03F 1/32* (2006.01)
(Continued)

(52) U.S. Cl.
CPC ......... *H03F 1/0288* (2013.01); *H03F 1/3288* (2013.01); *H03F 1/565* (2013.01);
(Continued)

(58) Field of Classification Search
CPC .................................................... H03F 1/0288
See application file for complete search history.

(56) References Cited

U.S. PATENT DOCUMENTS 8,836,432 B2 9/2014 Maniwa et al.
9,209,511 B2 12/2015 Mei
(Continued)

FOREIGN PATENT DOCUMENTS

JP 2008125044 A 5/2008
KR 20100094589 A 8/2010
(Continued)

OTHER PUBLICATIONS

International Search Report dated May 23, 2018 for PCT application No. PCT/US2016/023800.
(Continued)

*Primary Examiner* — Patricia T Nguyen

(57) ABSTRACT

The present invention relates to a Doherty combiner used in a Doherty power amplifier, the Doherty combiner comprising: a phase shift section connected to one end of a carrier amplifier so as to change a phase of an RF signal output from the carrier amplifier; a matching section connected to an output terminal of the Doherty power amplifier so as to impedance-match an output of the Doherty power amplifier; and a bandwidth improvement section connected to one end of a peaking amplifier so as to change at least one of a phase
(Continued)

bandwidth and an amplitude bandwidth of the Doherty power amplifier.

19 Claims, 59 Drawing Sheets

(51) Int. Cl.
  *H03F 1/56* (2006.01)
  *H03F 3/195* (2006.01)
  *H03F 3/24* (2006.01)
  *H03F 3/60* (2006.01)
(52) U.S. Cl.
  CPC ............ *H03F 3/195* (2013.01); *H03F 3/245* (2013.01); *H03F 3/602* (2013.01); *H03F 2200/451* (2013.01); *H03F 2203/21106* (2013.01); *H03F 2203/45501* (2013.01); *H03F 2203/45502* (2013.01)

(56) References Cited

U.S. PATENT DOCUMENTS

| | | | | |
|---|---|---|---|---|
| 9,966,903 | B1* | 5/2018 | McLaren | H03F 3/211 |
| 10,177,714 | B1* | 1/2019 | Mclaren | H03D 7/1441 |
| 2012/0235734 | A1* | 9/2012 | Pengelly | H03F 3/211 |
| | | | | 330/124 D |
| 2014/0340157 | A1 | 11/2014 | Xue et al. | |
| 2016/0164474 | A1* | 6/2016 | Beltran Lizarraga | H03F 3/211 |
| | | | | 375/219 |
| 2016/0308495 | A1* | 10/2016 | Canning | H03F 1/0288 |
| 2016/0336903 | A1* | 11/2016 | Ahmed | H03F 3/211 |
| 2017/0179898 | A1* | 6/2017 | Hayes | H03F 1/0216 |
| 2018/0123520 | A1* | 5/2018 | Szymanowski | H03F 3/211 |

FOREIGN PATENT DOCUMENTS

| | | |
|---|---|---|
| KR | 100983517 B1 | 9/2010 |
| KR | 20100127847 A | 12/2010 |

OTHER PUBLICATIONS

Grebennikov et al., "High-Efficiency Doherty Power Amplifiers: Historical Aspect and Modern Trends", Proceedings of the IEEE, Dec. 2012, pp. 3190-3219, vol. 100, No. 12.

Pang, "Normal Transmission-line Networks and Their Lumped LC Presentation", IEEE Transactions on microwave theory and techniques, Oct. 1973, pp. 601-607, vol. MTT-21, No. 10.

* cited by examiner

<LOW-PASS π TYPE>

<HIGH-PASS π TYPE>

<LOW-PASS T TYPE>

<HIGH-PASS T TYPE>

FIG. 13A

| FIRST LUMPED ELEMENT | SECOND LUMPED ELEMENT |
|---|---|
| LOW PASS | LOW PASS |
| LOW PASS | HIGH PASS |
| HIGH PASS | LOW PASS |
| HIGH PASS | HIGH PASS |

<π – π TYPE>

FIG. 13B

| FIRST LUMPED ELEMENT | SECOND LUMPED ELEMENT |
|---|---|
| LOW PASS | LOW PASS |
| LOW PASS | HIGH PASS |
| HIGH PASS | LOW PASS |
| HIGH PASS | HIGH PASS |

<T – T TYPE>

FIG. 13C

| FIRST LUMPED ELEMENT | SECOND LUMPED ELEMENT |
|---|---|
| LOW PASS | LOW PASS |
| LOW PASS | HIGH PASS |
| HIGH PASS | LOW PASS |
| HIGH PASS | HIGH PASS |

<π – T TYPE>

FIG. 13D

| FIRST LUMPED ELEMENT | SECOND LUMPED ELEMENT |
|---|---|
| LOW PASS | LOW PASS |
| LOW PASS | HIGH PASS |
| HIGH PASS | LOW PASS |
| HIGH PASS | HIGH PASS |

<T – π TYPE>

<LOW-PASS π TYPE>

<HIGH-PASS π TYPE>

<LOW-PASS T TYPE>

<HIGH-PASS T TYPE>

FIG. 34A

| FIRST LUMPED ELEMENT | SECOND LUMPED ELEMENT |
|---|---|
| LOW PASS | LOW PASS |
| LOW PASS | HIGH PASS |
| HIGH PASS | LOW PASS |
| HIGH PASS | HIGH PASS |

<π – π TYPE>

FIG. 34B

| FIRST LUMPED ELEMENT | SECOND LUMPED ELEMENT |
|---|---|
| LOW PASS | LOW PASS |
| LOW PASS | HIGH PASS |
| HIGH PASS | LOW PASS |
| HIGH PASS | HIGH PASS |

<T – T TYPE>

FIG. 34C

| FIRST LUMPED ELEMENT | SECOND LUMPED ELEMENT |
|---|---|
| LOW PASS | LOW PASS |
| LOW PASS | HIGH PASS |
| HIGH PASS | LOW PASS |
| HIGH PASS | HIGH PASS |

<π – T TYPE>

FIG. 34D

| FIRST LUMPED ELEMENT | SECOND LUMPED ELEMENT |
|---|---|
| LOW PASS | LOW PASS |
| LOW PASS | HIGH PASS |
| HIGH PASS | LOW PASS |
| HIGH PASS | HIGH PASS |

<T – π TYPE>

<LOW-PASS π TYPE>

<HIGH-PASS π TYPE>

<LOW-PASS T TYPE>

<HIGH-PASS T TYPE>

FIG. 37A

| FIRST LUMPED ELEMENT + FIRST RESONANT CIRCUIT | SECOND LUMPED ELEMENT + SECOND RESONANT CIRCUIT |
|---|---|
| LOW PASS+PARALLEL RESONANCE | LOW PASS+PARALLEL RESONANCE |
| LOW PASS+PARALLEL RESONANCE | HIGH PASS+PARALLEL RESONANCE |
| HIGH PASS+PARALLEL RESONANCE | LOW PASS+PARALLEL RESONANCE |
| HIGH PASS+PARALLEL RESONANCE | HIGH PASS+PARALLEL RESONANCE |

<π − π TYPE>

FIG. 37B

| FIRST LUMPED ELEMENT + FIRST RESONANT CIRCUIT | SECOND LUMPED ELEMENT + SECOND RESONANT CIRCUIT |
|---|---|
| LOW PASS+SERIAL RESONANCE | LOW PASS+SERIAL RESONANCE |
| LOW PASS+SERIAL RESONANCE | HIGH PASS+SERIAL RESONANCE |
| HIGH PASS+SERIAL RESONANCE | LOW PASS+SERIAL RESONANCE |
| HIGH PASS+SERIAL RESONANCE | HIGH PASS+SERIAL RESONANCE |

<T - T TYPE>

FIG. 37C

| FIRST LUMPED ELEMENT + FIRST RESONANT CIRCUIT | SECOND LUMPED ELEMENT + SECOND RESONANT CIRCUIT |
|---|---|
| LOW PASS+PARALLEL RESONANCE | LOW PASS+SERIAL RESONANCE |
| LOW PASS+PARALLEL RESONANCE | HIGH PASS+SERIAL RESONANCE |
| HIGH PASS+PARALLEL RESONANCE | LOW PASS+SERIAL RESONANCE |
| HIGH PASS+PARALLEL RESONANCE | HIGH PASS+SERIAL RESONANCE |

<π − T TYPE>

FIG. 37D

| FIRST LUMPED ELEMENT + FIRST RESONANT CIRCUIT | SECOND LUMPED ELEMENT + SECOND RESONANT CIRCUIT |
|---|---|
| LOW PASS+SERIAL RESONANCE | LOW PASS+PARALLEL RESONANCE |
| LOW PASS+SERIAL RESONANCE | HIGH PASS+PARALLEL RESONANCE |
| HIGH PASS+SERIAL RESONANCE | LOW PASS+PARALLEL RESONANCE |
| HIGH PASS+SERIAL RESONANCE | HIGH PASS+PARALLEL RESONANCE |

<T - π TYPE>

DOHERTY COMBINER

CROSS-REFERENCE TO RELATED APPLICATIONS

This application is a National Phase Entry Application of PCT Application No. PCT/KR2017/011732 filed on 23 Oct. 2017, which claims priority to Korean Patent Application No. 10-2017-0106729 filed on 23 Aug. 2017 in Korean Intellectual Property Office, the entire contents of which is hereby incorporated by reference in its entirety.

BACKGROUND OF THE INVENTION

Field of the Invention

The present invention relates to a Doherty combiner, and more particularly, to a Doherty combiner, which adds a transmission line or a resonant circuit to an output terminal of at least one amplifier constituting a Doherty power amplifier to improve a bandwidth of the Doherty power amplifier.

Background of the Invention

Modem mobile communication systems use a digital modulation communication scheme that can more efficiently use a limited frequency band. A digitally modulated signal is amplified up to a desired transmission output by using a radio frequency (RF) power amplifier and a power amplifier should have a high linearity characteristic for distortion-free transmission of the signal.

In addition, high linearity and high efficiency characteristics of the amplifier have also gradually been important characteristic items in recent years due to a heat problem with an increase in power level and miniaturization of the power amplifier. As a method capable of simultaneously achieving the high linearity and high efficiency characteristics, an interest in a Doherty power amplifier gradually increases.

The Doherty power amplifier is first proposed as a method for conserving power or increasing efficiency and has an advantage of an easy implementation scheme and high power efficiency, but a disadvantage of a small bandwidth. Various researches for improving the small bandwidth of the Doherty power amplifier are in progress.

FIG. 1 is a diagram illustrating a configuration of a Doherty power amplifier in the related art. As illustrated in FIG. 1, a Doherty power amplifier 100 includes a coupler 110, a carrier amplifier 120, a peaking amplifier 130, and a Doherty combiner 140. The Doherty combiner 140 is constituted by a 90° phase shift section and a matching section.

Power is combined with the Doherty combiner 140 at a $p'_1$ point which is an output terminal of the carrier amplifier 120, combined with the Doherty combiner 140 at a $p'_2$ point which is an output terminal of the peaking amplifier 130, and combined at a $p'_3$ point which is an output terminal of the Doherty power amplifier 100 to be output.

However, since a phase difference between the $p'_1$ point and the $p'_2$ point has a phase difference of 90 only at a center frequency due to the 90° phase shift section, the Doherty combiner 100 in the related art has a very small phase bandwidth. Accordingly, a Doherty combiner needs to be developed, which is configured to have the same phase difference even in a frequency band which is out of the center frequency (i.e., to improve the phase bandwidth).

BRIEF SUMMARY OF THE INVENTION

An object of the present invention is to solve the problems and other problems.

Another object of the present invention is to provide a Doherty combiner which adds one or more transmission lines to an output terminal of at least one amplifier to improve a phase bandwidth of a Doherty power amplifier.

Yet another object of the present invention is to provide a Doherty combiner which adds one or more resonant circuits to an output terminal of at least one amplifier to improve a phase bandwidth of a Doherty power amplifier.

In order to achieve the objects or another object, according to an aspect of the present invention, provided is a Doherty combiner which includes: a phase shift section connected to one end of a carrier amplifier so as to change a phase of an RF signal output from the carrier amplifier; a matching section connected to an output terminal of the Doherty power amplifier so as to impedance-match an output of the Doherty power amplifier; and a bandwidth improvement section connected to one end of a peaking amplifier so as to change at least one of a phase bandwidth and a magnitude bandwidth of the Doherty power amplifier.

More preferably, the bandwidth improvement section includes a 180° phase shift line.

More preferably, the bandwidth improvement section includes a 180° phase shift line connected to one end of the peaking amplifier and a parallel resonant circuit in which a first inductor and a first capacitor connected to the 180° phase shift line are connected in parallel.

More preferably, the bandwidth improvement section includes a 180° phase shift line connected to one end of the peaking amplifier and a short stub connected to the 180° phase shift line.

More preferably, the bandwidth improvement section includes a serial resonant circuit in which an inductor L and a capacitor C are connected in series.

More preferably, the bandwidth improvement section includes a serial resonant circuit in which a first inductor and a first capacitor are connected in series and a parallel resonant circuit in which a second inductor and a second capacitor are connected in parallel.

More preferably, the phase shift section includes a first transmission line for combining outputs of the carrier amplifier and the peaking amplifier, and the matching section includes a second transmission line for impedance-matching the output of the Doherty power amplifier.

More preferably, the phase shift section includes first lumped elements having an equivalent relationship to a transmission line for combining the outputs of the carrier amplifier and the peaking amplifier, and the matching section includes second lumped elements having an equivalent relationship to a transmission line for impedance-matching the output of the Doherty power amplifier. The first lumped element may be configured by any one of a Low-Pass π Type LC circuit, a High-Pass π Type LC circuit, a Low-Pass T Type LC circuit, and a High-Pass T Type LC circuit, and the second lumped element may be configured by any one of a Low-Pass π Type LC circuit, a High-Pass π Type LC circuit, a Low-Pass T Type LC circuit, and a High-Pass T Type LC circuit. Further, the second lumped element may have a different L/C value from the first lumped element.

More preferably, the phase shift section includes a first lumped element and a first resonant circuit having the equivalent relationship to the transmission line for combining the outputs of the carrier amplifier and the peaking amplifier, and the matching section includes a second lumped element and a second resonant circuit having the equivalent relationship to the transmission line for impedance-matching the output of the Doherty power amplifier. When the first or second lumped element is a π type structure, the first or second resonant circuit may be configured by the parallel resonant circuit, and when the first or second lumped element is a T type structure, the first or second resonant circuit may be configured by the serial resonant circuit. Further, the second resonant circuit may have the same L/C value as the first resonant circuit.

More preferably, the bandwidth improvement section includes a serial resonant circuit in which the inductor and the capacitor are connected in series and a short stub connected to the serial resonant circuit.

More preferably, the bandwidth improvement section includes a distributed element circuit having the equivalent relationship to a lumped element circuit corresponding to the serial resonant circuit. The distributed element circuit may include two transmission lines and capacitors equally substituted by Kuroda's Identities.

BRIEF DESCRIPTION OF THE DRAWINGS

FIGS. 13A to 13D is a diagram referred to for describing various types of Doherty combiners according to a combination of a first lumped element and a second lumped element;

FIGS. 34A to 34D are diagrams referred to for describing Doherty combiners according to various combinations of a first lumped element and a second lumped element;

FIGS. 37A to 37D are diagrams referred to for describing Doherty combiners according to various combinations of a first lumped element and a first resonant circuit and a second lumped element and a second resonant circuit;

DETAILED DESCRIPTION OF THE INVENTION

Figure 1:
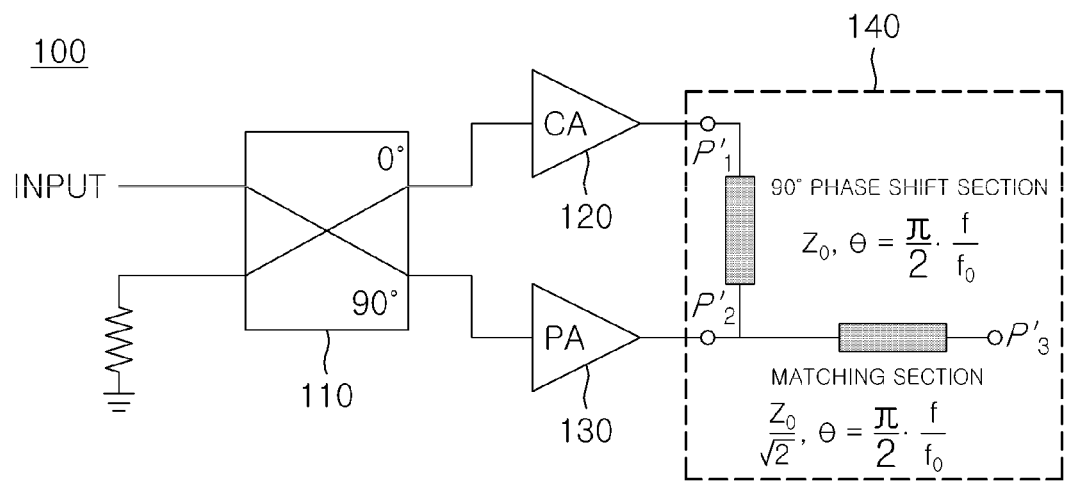
FIG. 1 is a diagram illustrating a configuration of a Doherty power amplifier in the related art.

Hereinafter, embodiments disclosed in this specification will be described in detail with reference to the accompanying drawings and the same or similar components are denoted by the same reference numerals regardless of a sign of the drawing, and duplicated description thereof will be omitted. Suffixes "module" and "unit" for components used in the following description are given or mixed in consideration of easy preparation of the specification only and do not have their own distinguished meanings or roles.

Further, in describing the embodiment of this specification, a detailed description of related known technologies will be omitted if it is determined that the detailed description makes the gist of the embodiment disclosed in this specification unclear. Further, it is to be understood that the accompanying drawings are just used for easily understanding the embodiments disclosed in this specification and a technical spirit disclosed in this specification is not limited by the accompanying drawings and all changes, equivalents, or substitutes included in the spirit and the technical scope of the present invention are included.

The present invention proposes a Doherty combiner which adds one or more transmission lines or resonant circuits to an output terminal of at least one amplifier constituting a Doherty power amplifier to improve a bandwidth of the Doherty power amplifier.

Hereinafter, various embodiments of the present invention will be described in detail with reference to drawings.

Figure 2:
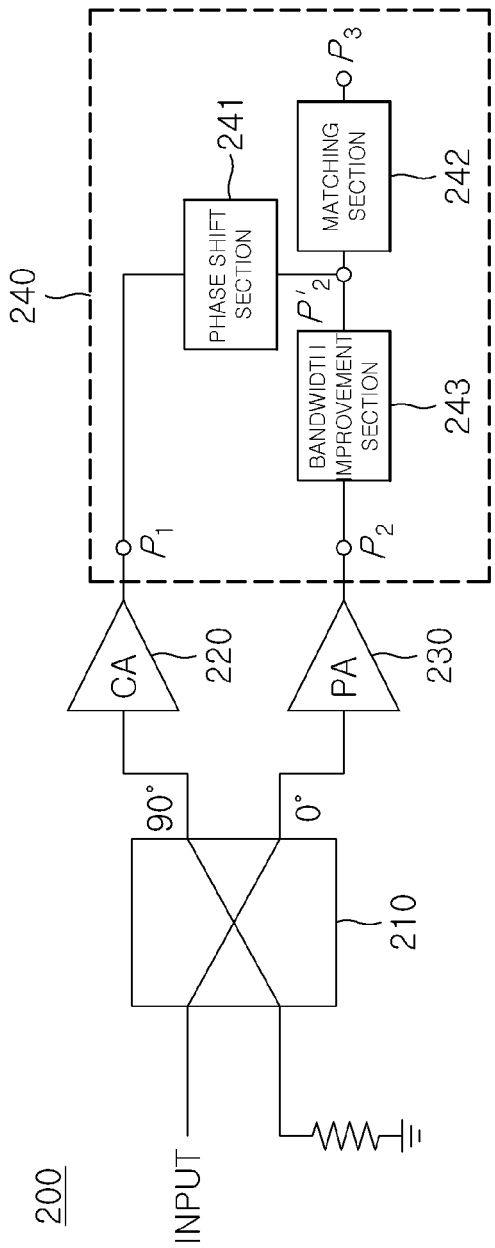
FIG. 2 is a diagram illustrating a configuration of a Doherty power amplifier 200 according to the present invention.

FIG. 2 is a diagram illustrating a configuration of a Doherty power amplifier 200 according to the present invention.

Referring to FIG. 2, a Doherty power amplifier 200 may include a coupler 210, a carrier amplifier 220, a peaking amplifier 230, and a Doherty combiner 240.

The coupler 210 may couple an RF signal received from a communication modem (not illustrated) and output the coupled RF signal to the carrier amplifier 220 and the peaking amplifier 230.

The carrier amplifier 220 and the peaking amplifier 230 may amplify the RF signal received from the coupler 210 and output the amplified RF signal to the Doherty combiner 240. In order to maintain high efficiency of the Doherty power amplifier 200, only the carrier amplifier 220 may operate in a low output and both amplifiers 220 and 230 may operate in parallel in a high output. Hereinafter, in the embodiments, a transistor of the carrier amplifier 220 may be biased to class AB and the transistor of the peaking amplifier 230 may be biased to class C and the present invention is not limited thereto.

The Doherty combiner 240 may serve to combine a first RF signal output from the carrier amplifier 220 and a second RF signal output from the peaking amplifier 230 and output the combined RF signal in an antenna end direction.

The Doherty combiner 240 may include a phase shift section 241 connected to an output terminal $P_1$ of the carrier amplifier 220, a matching section 242 connected to an output terminal $P_3$ of the Doherty power amplifier 200, and a bandwidth improvement section 243 connected to an output terminal $P_2$ of the peaking amplifier 230. The phase shift section 241, the matching section 242, and the bandwidth improvement section 243 may meet at the $P_2'$ point.

The phase shift section 241 may perform a phase shift function for combining outputs of the carrier amplifier 220 and the peaking amplifier 230. The phase shift section 241 may be constituted by a transmission line or lumped elements and the present invention is not limited thereto.

The matching section 242 may serve to impedance-match the output of the Doherty power amplifier 200. Similarly, the matching section 242 may be constituted by the transmission line or lumped elements and the present invention is not limited thereto.

The bandwidth improvement section 243 may serve to improve a phase bandwidth and/or a magnitude bandwidth of the Doherty power amplifier 200. The bandwidth improvement section 243 may be constituted by the transmission line or one or more resonant circuits and the present invention is not limited thereto.

The Doherty combiner 240 may improve a phase difference between an RF signal output from the carrier amplifier 220 and an RF signal output from the peaking amplifier 230 using the bandwidth improvement section 243. Further, the Doherty combiner 240 adds the bandwidth improvement section 243 to the output terminal $P_2$ of the peaking amplifier 230 to improve the magnitude bandwidth of the Doherty power amplifier 200 and implement the output terminal of the peaking amplifier 230 as an impedance different from 50 ohm.

Hereinafter, Doherty combiners according to various embodiments of the present invention will be described in detail.

First Embodiment

Figure 3:
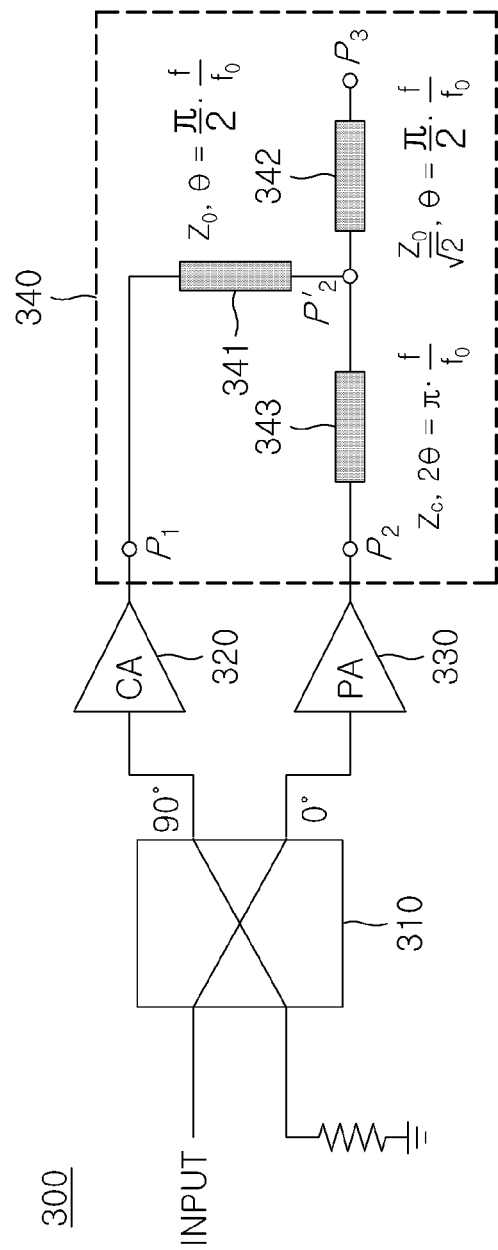
FIG. 3 is a diagram illustrating a configuration of a Doherty power amplifier according to a first embodiment of the present invention.

FIG. 3 is a diagram illustrating a configuration of a Doherty power amplifier according to a first embodiment of the present invention.

Referring to FIG. 3, a Doherty power amplifier 300 according to a first embodiment of the present invention may include a coupler 310, a carrier amplifier 320, a peaking amplifier 330, and a Doherty combiner 340. Since the coupler 310, the carrier amplifier 320, and the peaking amplifier 330 are the same as the coupler 210, the carrier amplifier 220, and the peaking amplifier 230 illustrated in FIG. 2, a detailed description thereof is omitted.

The Doherty combiner 340 may serve to combine a first RF signal output from the carrier amplifier 320 and a second RF signal output from the peaking amplifier 330 and output the combined RF signal in an antenna end direction.

The Doherty combiner 340 may include a first transmission line 341 connected to the output terminal $P_1$ of the carrier amplifier 320, a second transmission line 342 connected to the output terminal $P_3$ of the Doherty power amplifier 300, and a third transmission line 343 connected to the output terminal $P_2$ of the peaking amplifier 330.

The first transmission line 341 may be constituted by a 90° phase shift line for combining the outputs of the carrier amplifier 320 and the peaking amplifier 330. In this case, the first transmission line 341 may have a characteristic impedance of $Z_0$ and an electrical length of $$\theta\left(=\frac{\pi}{2}\frac{f}{f_0}\right).$$

The characteristic impedance $Z_0$ is equal to an output impedance of the end of the carrier amplifier 320 (however, a slight change is possible for extension of a bandwidth).

The second transmission line 342 may be constituted by a transmission line for matching the output of the Doherty power amplifier 300. In this case, the second transmission line 342 may have a characteristic impedance of $Z_0/\sqrt{2}$ and an electrical length of $$\theta\left(=\frac{\pi}{2}\frac{f}{f_0}\right).$$

The third transmission line 343 may be constituted by a 180° phase shift line for improving the bandwidth of the Doherty power amplifier 300. In this case, the third transmission line 343 may have a characteristic impedance of $Z_C$ and an electrical length of $$2\theta\left(=\pi\frac{f}{f_0}\right).$$

The Doherty combiner 340 may improve a phase difference between an RF signal input from the carrier amplifier 320 and an RF signal input from the peaking amplifier 330 using the third transmission line 343. Further, the Doherty combiner 340 adds the third transmission line 343 to the output terminal P₂ of the peaking amplifier 330 to implement the end of the peaking amplifier 330 as an impedance lower than 50 ohm.

As illustrated in FIG. 3, when a phase at the p'2 point is checked, the RF signal is input from the carrier amplifier 320 at a phase of θ and the RF signal is input from the peaking amplifier 330 at a phase of $$-\tan^{-1}\left\{\frac{\frac{\sin 2\theta}{2} \times \left(\frac{Z_C}{Z_0} + \frac{Z_0}{Z_C}\right)}{\cos 2\theta}\right\}.$$

The RF signals input from both amplifiers 320 and 330 have a phase difference of $$\theta + \tan^{-1}\left\{\frac{\frac{\sin 2\theta}{2} \times \left(\frac{Z_C}{Z_0} + \frac{Z_0}{Z_C}\right)}{\cos 2\theta}\right\}$$

at a center frequency $f_0$ and has a phase of $$\theta \cdot \frac{\omega}{\omega_0} + \tan^{-1}\left\{\frac{\sin\left(2\theta\frac{\omega}{\omega_0}\right)}{2} \times \left(\frac{Z_C}{Z_0} + \frac{Z_0}{Z_C}\right)}{\cos\left(2\theta\frac{\omega}{\omega_0}\right)}\right\}$$

at a selection frequency f other than the center frequency $f_0$. In order to provide a phase difference of 90° at the selection frequency f, a value of the characteristic impedance $Z_c$ of the third transmission line 343 added to the output terminal of the peaking amplifier 330 may be determined. A method for calculating the characteristic impedance ($Z_c$) value will be described below with reference to FIGS. 4A and 4B below.

Figure 4A:
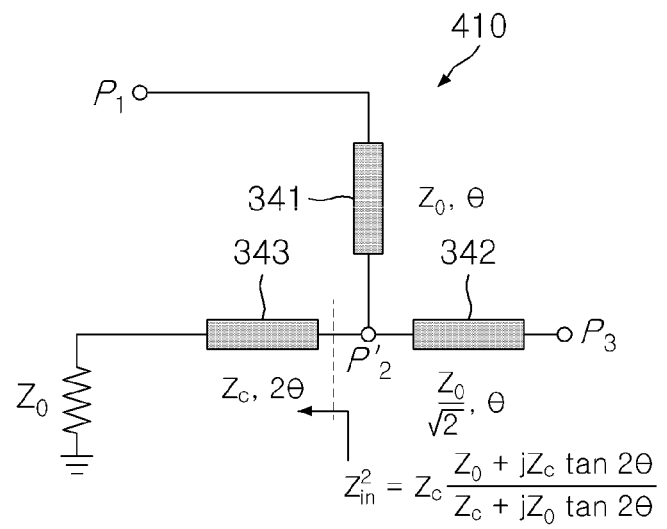
FIGS. 4A to 4B are diagrams illustrating an equivalent circuit for a Doherty combiner 340 of FIG. 3.
Figure 4B:
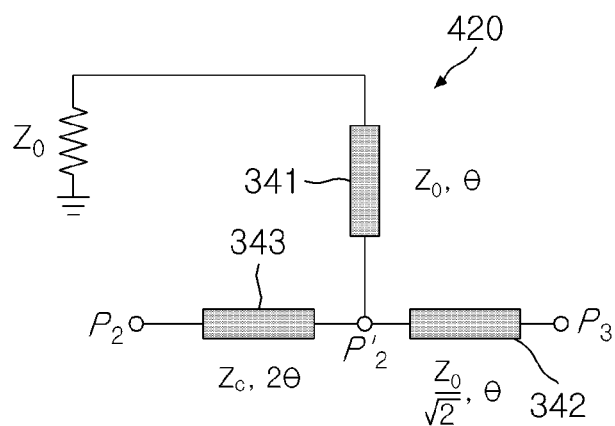

FIGS. 4A and 4B is a diagram illustrating an equivalent circuit for a Doherty power amplifier 300 of FIG. 3.

As illustrated in FIG. 4A, a first equivalent circuit 410 as an equivalent circuit for viewing an input/output magnitude and phase from the carrier amplifier 320 is an equivalent circuit configured by terminating the p₂ point of the peaking amplifier 330 to $Z_0$.

In order to view the input/output phase from the carrier amplifier 320, a phase θ from the end p₁ of the carrier amplifier 320 to the p'₂ point and a phase from the p'₂ point to the output terminal p₃ of the Doherty power amplifier 300 are summed up.

The phase from the p'₂ point to the output terminal p₃ of the Doherty power amplifier 300 may be acquired through ABCD-parameters shown in Equation 1 below.

$$\begin{bmatrix} A & B \\ C & D \end{bmatrix}_{32'} = \begin{bmatrix} \cos\theta & j\frac{Z_0}{\sqrt{2}}\sin\theta \\ \frac{Z_C + j50\tan 2\theta}{Z_C(50 + jZ_C\tan 2\theta)}\cos\theta + j\frac{Z_0}{\sqrt{2}}\sin\theta & j\frac{Z_0}{\sqrt{2}}\frac{Z_C + j50\tan 2\theta}{Z_C(50 + jZ_C\tan 2\theta)}\sin\theta + \cos\theta \end{bmatrix} \quad \text{[Equation 1]}$$

Meanwhile, as illustrated in FIG. 4B, a second equivalent circuit 420 as an equivalent circuit for viewing an input/output magnitude and phase from the peaking amplifier 330 is an equivalent circuit configured by terminating the p₁ point of the carrier amplifier 320 to $Z_0$.

In order to view the input/output phase from the peaking amplifier 330, a phase θ from the end p₂ of the peaking amplifier 330 to the output terminal p₃ of the Doherty power amplifier 300 may be acquired through ABCD-parameters shown in Equation 2 below.

$$\begin{bmatrix} A & B \\ C & D \end{bmatrix}_{32} = \begin{bmatrix} \cos 2\theta \cos\theta + j\frac{Z_C}{Z_0}\sin 2\theta \cos\theta - \frac{\sqrt{2}Z_C}{Z_0}\sin 2\theta \sin\theta & j\frac{Z_0}{\sqrt{2}}\cos 2\theta \sin\theta - \frac{Z_C}{\sqrt{2}}\sin 2\theta \sin\theta + jZ_C\sin 2\theta \cos\theta \\ j\frac{2}{Z_C}\sin 2\theta \cos\theta + \frac{2}{Z_0}\cos 2\theta \cos\theta + j\frac{\sqrt{2}}{Z_0}\cos 2\theta \sin\theta & j\frac{2}{\sqrt{2}}\cos 2\theta \sin\theta - \frac{Z_0}{\sqrt{2}Z_c}\sin 2\theta \sin\theta + \frac{2}{Z_0}\cos 2\theta \cos\theta \end{bmatrix} \quad \text{[Equation 2]}$$

By using the ABCD-parameters of Equations 1 and 2 described above, it is possible to check the phase of the Doherty combiner 340 according to an embodiment of the present invention. When the carrier amplifier end is used as an input, a phase (i.e., an electrical length θ of a phase shift line 341) from the p₁ point to the p'₂ point may be acquired and a phase ∠ S'₃₁ from the p'₂ point to the p₃ point may be acquired through parameter conversion of the ABCD-parameters obtained from Equation 1 described above.

An output phase ∠ S₃₁ from the carrier amplifier 320 may be acquired by summing up both phases calculated above and the output phase ∠ S₃₁ may be defined as shown in Equation 3 below.

$$\angle S_{31} = \theta + \angle S'_{31} \quad \text{[Equation 3]}$$

$$\angle S_{31} = \theta - \angle \tan^{-1}$$

$$\left\{\frac{\left(\frac{1}{\sqrt{2}} + \sqrt{2}\right)\sin\theta + \left(\frac{A}{50^2 Z_C^2 + Z_C^4 \tan 2\theta^2}\right)\cos\theta + \left(\frac{B}{2(50^2 Z_C^2 + Z_C^4 \tan 2\theta^2)}\right)\sin\theta}{2\cos\theta + \left(\frac{C}{50^2 Z_C^2 + Z_C^4 \tan 2\theta^2}\right)\cos\theta + \left(\frac{D}{2(50^2 Z_C^2 + Z_C^4 \tan 2\theta^2)}\right)\sin\theta}\right\}$$

Meanwhile, when the peaking amplifier end is used as the input, an output phase $\angle S_{32}$ from the peaking amplifier 330 corresponds to a phase from the end $p_2$ of the peaking amplifier 330 to the output terminal $p_3$ of the Doherty power amplifier 300. Accordingly, the output phase $\angle S_{32}$ may be defined as shown in Equation 4 below through the parameter conversion of Equation 2 described above.

$$\angle S_{32} = -\angle\tan^{-1}\left\{\frac{\sin2\theta\cos\theta\left(\frac{2Z_C}{Z_0}+\frac{Z_0}{Z_C}\right)+2\sqrt{2}\cos2\theta\sin\theta}{3\cos2\theta\cos\theta-\sin2\theta\sin\theta\left(\frac{3\sqrt{2}Z_C}{2Z_0}+\frac{\sqrt{2}Z_0}{2Z_C}\right)}\right\} \quad \text{[Equation 4]}$$

In this case, $A = Z_0 \ Z_C \ \tan2\theta(50^2-Z_C^2)$ $B=50 \sqrt{2}Z_0Z_C^2(1+\tan2\theta^2)$ $C=50 \ Z_0 \ Z_C^2(1+\tan2\theta^2)$, and $D= \sqrt{2}Z_0Z_C \tan2\theta(50^2-Z_C^2)$.

Based on Equations 3 and 4 described above, when a phase difference between the output phase $\angle S_{31}$ from the carrier amplifier 320 and the output phase $\angle S_{32}$ from the peaking amplifier 330 is $\Phi$, $\Phi$ may be defined as shown in Equation 5 below.

$$\Phi = \angle S_{31} - \angle S_{32} = (\theta + \angle S'_{31}) - \angle S_{32} \quad \text{[Equation 5]}$$

A phase difference $\Phi_o$ at the center frequency $f_0$ and a phase difference $\Phi$ at a specific frequency $f$ may be acquired using Equation 5 described above. In other words, when the phase difference $\Phi_o$ at the center frequency $f_0$ is acquired, $\Phi_0 = \theta_0 + \angle S_{31}|_{\theta_0} - \angle S_{32}|_{\theta_0}$ and when the phase difference $\Phi$ at the selection frequency $f$ is acquired, $\Phi = \theta + \angle S'_{31}|_{\theta} - \angle S_{32}|_{\theta}$.

The phase difference between the center frequency to and the selection frequency $f$ may be acquired as shown in Equation 6 below by using phase differences $\Phi_o$ and $\Phi$ at both frequencies.

$$\Phi_0 - \Phi = \left(\theta_0 - \theta_0\frac{\omega}{\omega_0}\right) + (\angle S'_{31}|_{\theta_0} - \angle S'_{31}|_{\theta}) - (\angle S_{32}|_{\theta_0} - \angle S_{32}|_{\theta}) \quad \text{[Equation 6]}$$

In Equation 6 above, $\theta_o$ represents a value determined as the electrical length of the first transmission line 341 and $$\theta_0 = \frac{\pi}{2}$$

and when the value of $\theta_o$ is substituted in Equation 6 above and organized, an equation shown in Equation 7 below may be obtained.

$$(\Phi_0 - \Phi) - \frac{\pi}{2}\left(1 - \frac{\omega}{\omega_0}\right) = -\angle S'_{31}|\theta + \angle S_{32}|\theta \quad \text{[Equation 7]}$$

Last, after the phase $\angle S'_{31}$ and the phase $\angle S_{32}$ obtained in Equations 3 and 4 described above are substituted in Equation 7, when an equation for $Z_c$ is computed, a characteristic impedance value $Z_c$ of the third transmission line 343 may be acquired.

Figure 5A:
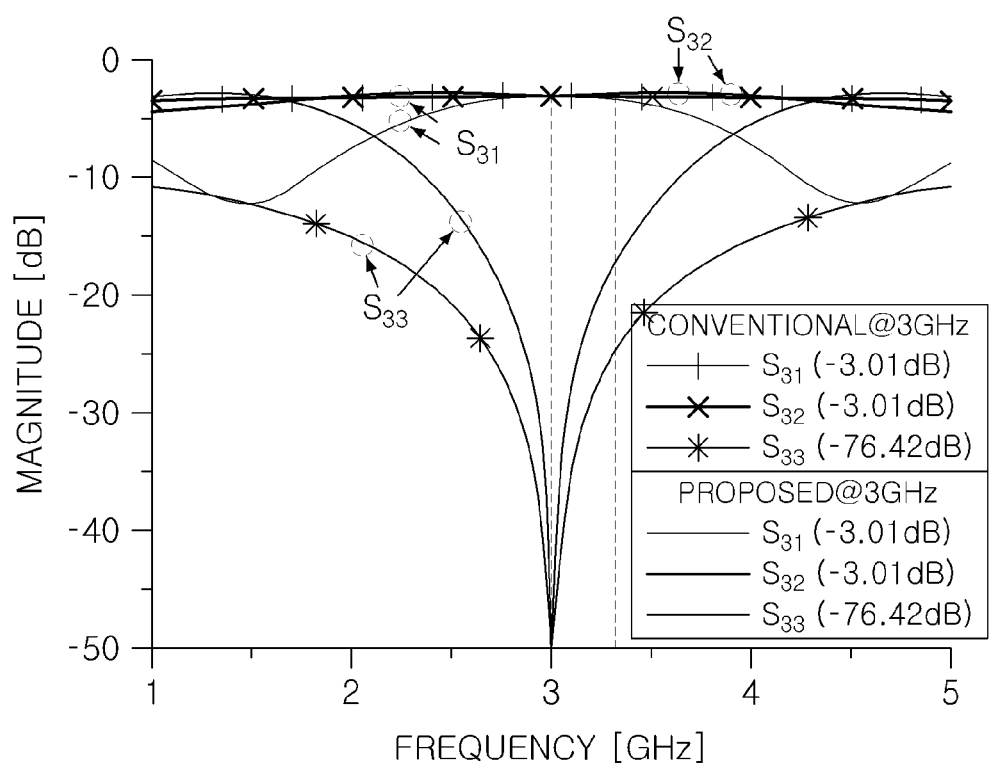
FIGS. 5A to 5B are diagrams illustrating a comparison in performance between the Doherty combiner in the related art and the Doherty combiner of FIG. 3.
Figure 5B:
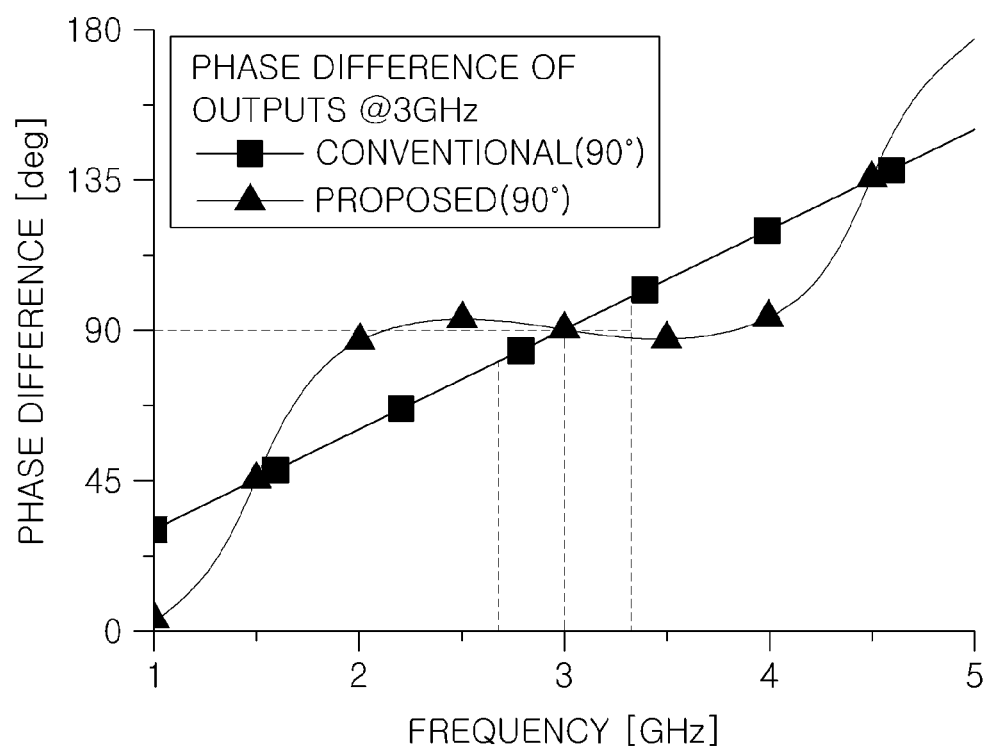

FIGS. 5A to 5B are diagrams illustrating a comparison in performance between the Doherty combiner in the related art and the Doherty combiner of FIG. 3. More specifically, FIG. 5A is a diagram illustrating a result of simulating magnitude characteristics of the Doherty combiner in the related art and the Doherty combiner of the present invention and FIG. 5B is a diagram illustrating a result of simulating phase difference characteristics of the Doherty combiner in the related art and the Doherty combiner of the present invention.

In the simulation, the Doherty combiner according to the present invention is designed with a first transmission line of $Z_0=50$ ohm and $\theta=90°$, a second transmission line of $$\frac{Z_0}{\sqrt{2}} = 35.36\Omega$$

and $\theta=90°$, and a third transmission line of $Z_C=18.89\Omega$ and $2\theta=180°$.

As illustrated in FIG. 5A, in both the Doherty combiner in the related art and the Doherty combiner of the present invention, it may be verified that power is distributed with −3.01 dB at a center frequency (3 GHz). Additionally, at a selection frequency (3.2 GHz) which is out of the center frequency (3 GHz), it may be verified that in the Doherty combiner in the related art, the power is distributed with $S_{31}=-3.02$ dB and $S_{32}=-3.02$ dB and in the Doherty combiner of the present invention, the power is distributed with $S_{31}=-3.27$ dB and $S_{32}=-2.92$ dB.

Further, as illustrated in FIG. 5B, it may be verified that in the case of the Doherty combiner in the related art, a phase bandwidth of 90±2° from the center frequency (3 GHz) is a narrow bandwidth of 4.66% as 2.93 GHz to 3.07 GHz, while in the case of the Doherty combiner of the present invention, the phase bandwidth is a wide bandwidth of 20% as 2.7 GHz to 3.3 GHz. Accordingly, it may be verified that in the case of the Doherty combiner according to the present invention, the phase bandwidth may be improved in a desired frequency domain and the power is appropriately distributed.

Second Embodiment

Figure 6A:
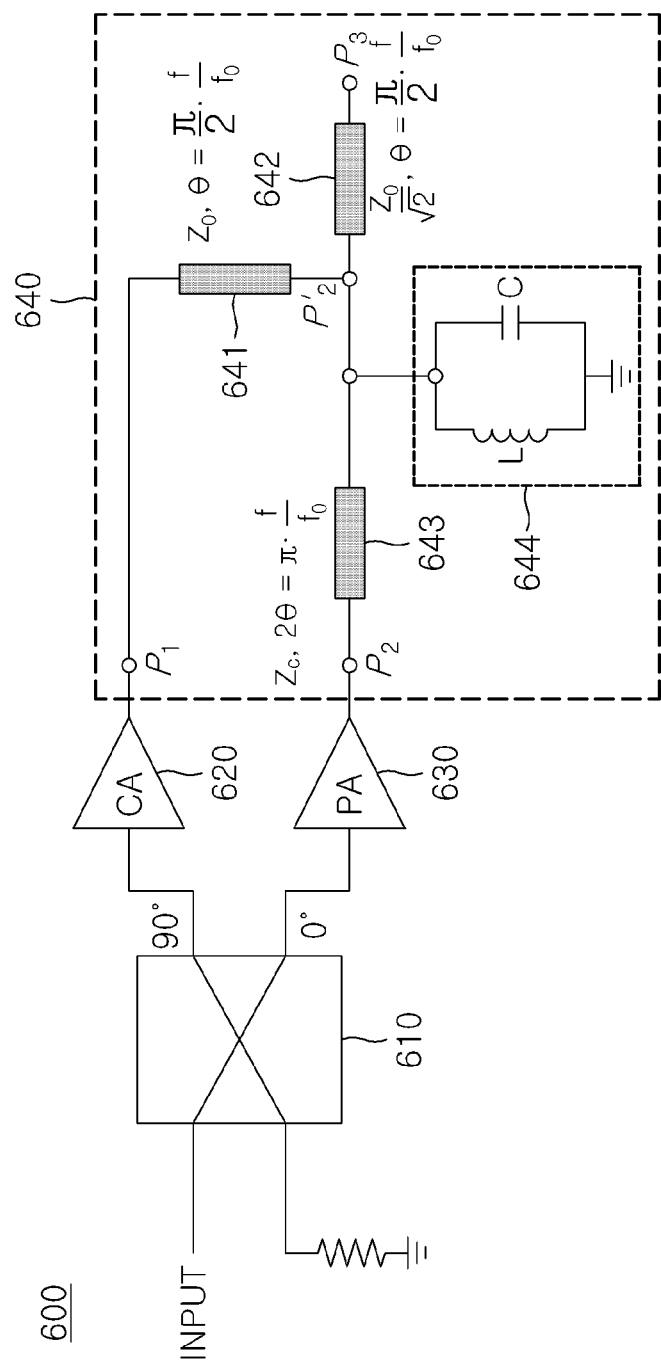
FIGS. 6A and 6B are diagrams illustrating a configuration of a Doherty power amplifier according to a second embodiment of the present invention.
Figure 6B:
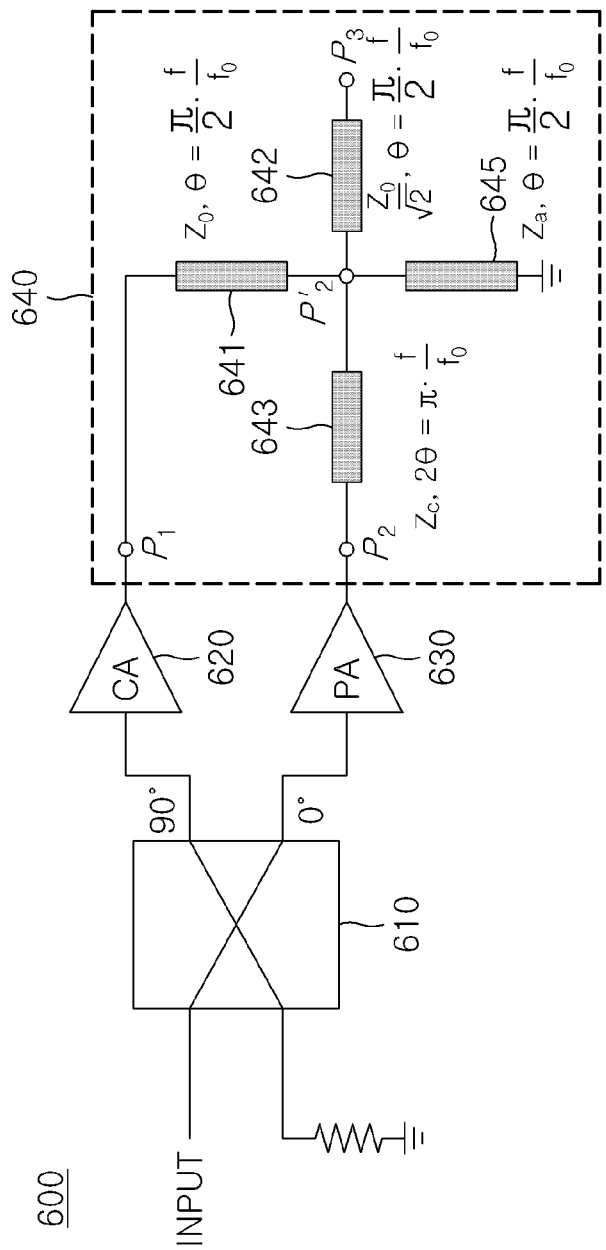

FIGS. 6A and 6B are diagrams illustrating a configuration of a Doherty power amplifier according to a second embodiment of the present invention.

Referring to FIGS. 6A and 6B, a Doherty power amplifier 600 according to a second embodiment of the present invention may include a coupler 610, a carrier amplifier 620, a peaking amplifier 630, and a Doherty combiner 640. Since the coupler 610, the carrier amplifier 620, and the peaking amplifier 630 are the same as the coupler 210, the carrier amplifier 220, and the peaking amplifier 230 illustrated in FIG. 2, a detailed description thereof is omitted.

As an embodiment, as illustrated in FIG. 6A, the Doherty combiner 640 according to the present invention may include a first transmission line 641 connected to the output terminal $P_1$ of the carrier amplifier 620, a second transmission line 642 connected to the output terminal $P_3$ of the Doherty power amplifier 600, a third transmission line 643 connected to the output terminal $P_2$ of the peaking amplifier 630, and a parallel resonant circuit 644 connected to a ground at the $P_2'$ point.

As another embodiment, as illustrated in FIG. 6B, the Doherty combiner 640 according to the present invention may include a first transmission line 641 connected to the output terminal $P_1$ of the carrier amplifier 620, a second transmission line 642 connected to the output terminal $P_3$ of the Doherty power amplifier 600, a third transmission line 643 connected to the output terminal $P_2$ of the peaking amplifier 630, and a fourth transmission line 645 connected to the ground at the $P_2'$ point.

The first transmission line 641 may be constituted by a 90° phase shift line for combining the outputs of the carrier amplifier 620 and the peaking amplifier 630. In this case, the first transmission line 641 may have a characteristic impedance of $Z_0$ and an electrical length of $$\theta \left( = \frac{\pi}{2} \frac{f}{f_0} \right).$$

The second transmission line 642 may be constituted by a transmission line for matching the output of the Doherty power amplifier 600. In this case, the second transmission line 642 may have a characteristic impedance of $Z_0/\sqrt{2}$ and an electrical length of $$\theta \left( = \frac{\pi}{2} \frac{f}{f_0} \right).$$

The third transmission line 643 may be constituted by a 180° phase shift line for improving the bandwidth of the Doherty power amplifier 600. In this case, the third transmission line 643 may have a characteristic impedance of $Z_C$ and an electrical length of $$2\theta \left( = \pi \frac{f}{f_0} \right).$$

The characteristic impedance value of the third transmission line 643 may be calculated by using the method described in FIGS. 4A to 4B above.

The parallel resonant circuit 644 may be constituted by L/C passive elements for improving the magnitude bandwidth of the Doherty power amplifier 600. In this case, an inductor L and a capacitor C may be connected to each other in parallel.

The fourth transmission line 645 may be constituted by a short stub which is an equivalent circuit to the parallel resonant circuit 644. In this case, the fourth transmission line 645 may have a characteristic impedance of $Z_a$ and an electrical length of $$\theta \left( = \frac{\pi}{2} \frac{f}{f_0} \right).$$

The characteristic impedance $Z_a$ may be defined through Equation 8 below.

$$Z_A = \frac{1}{8fC} \quad \text{[Equation 8]}$$

Here, C represents a capacitor value of the parallel resonant circuit.

The Doherty combiner 640 illustrated in FIG. 6A may improve the magnitude bandwidth of the Doherty power amplifier 600 using the third transmission line 643 and the parallel resonant circuit 644. Further, the Doherty combiner 640 adds the third transmission line 643 and the parallel resonant circuit 644 to the output terminal $P_2$ of the peaking amplifier 630 to implement the end of the peaking amplifier 630 as an impedance different from 50 ohm.

Similarly, the Doherty combiner 640 illustrated in FIG. 6B may improve the magnitude bandwidth of the Doherty power amplifier 600 using the third and fourth transmission lines 643 and 645. Further, the Doherty combiner 640 adds the third and fourth transmission lines 643 and 645 to the output terminal $P_2$ of the peaking amplifier 630 to implement the end of the peaking amplifier 630 as an impedance different from 50 ohm.

Figure 7A:
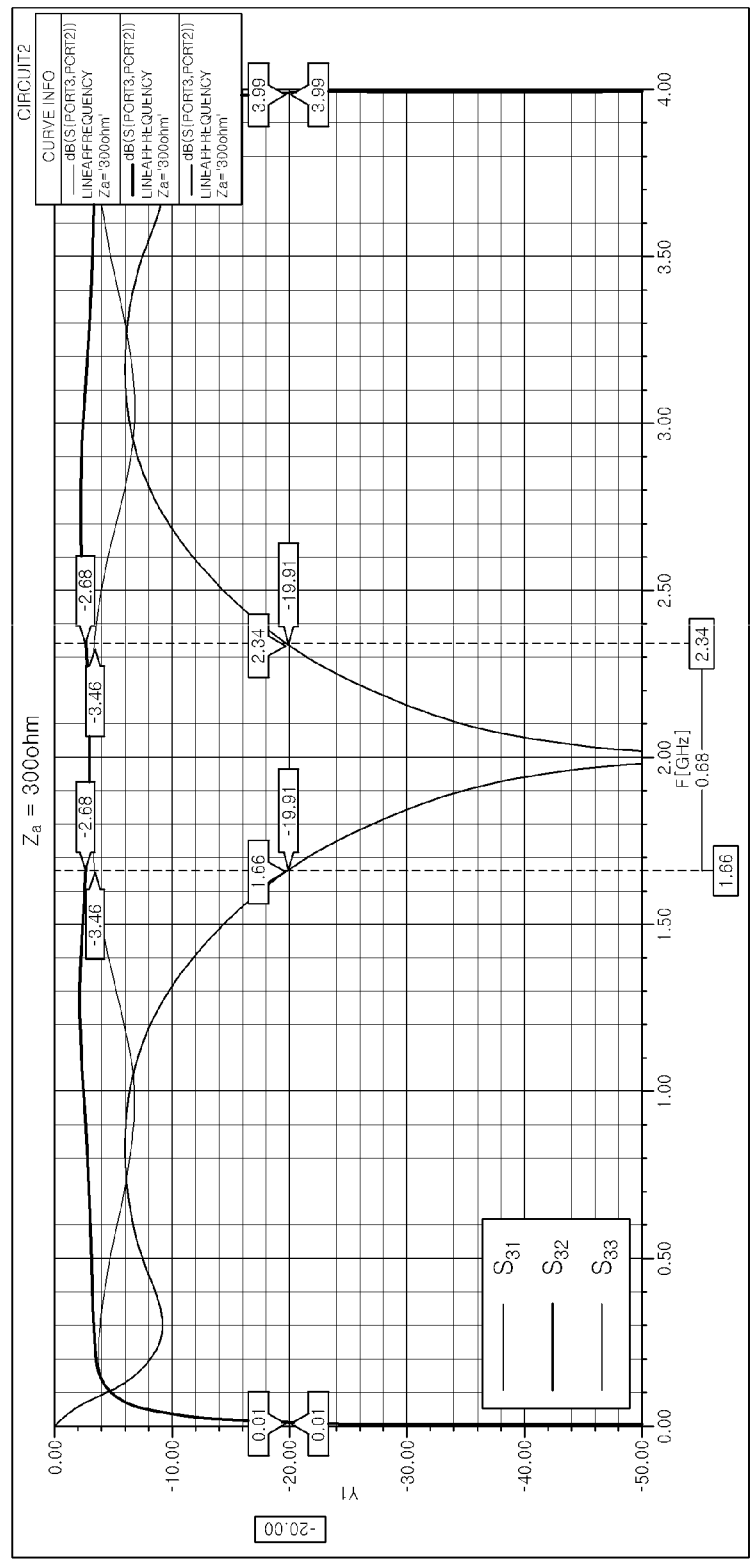
FIG. 7A is a diagram illustrating a result of simulating a magnitude characteristic of the Doherty combiner of FIG. 6B.
Figure 7B:
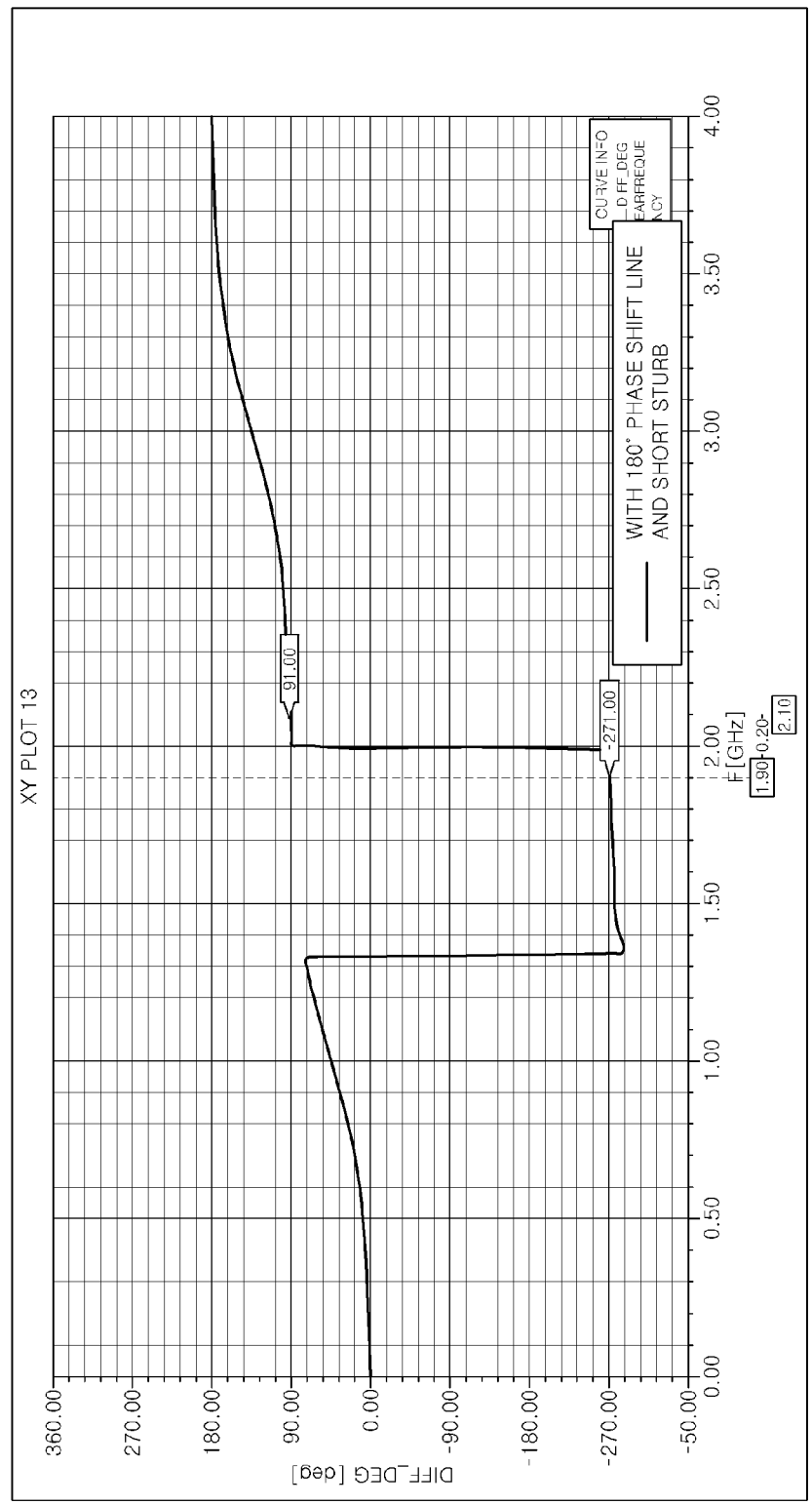
FIG. 7B is a diagram illustrating a result of simulating a phase difference characteristic of the Doherty combiner of FIG. 6B.

FIG. 7A is a diagram illustrating a result of simulating the magnitude characteristic of the Doherty combiner of FIG. 6B and FIG. 7B is a diagram illustrating a result of simulating the phase difference characteristic of the Doherty combiner of FIG. 6B.

In the simulation, the Doherty combiner according to the present invention is designed with a first transmission line of $Z_0$=50 ohm and θ=90°, a second transmission line of $Z_0/\sqrt{2}$=35.35 ohm and θ=90°, a third transmission line of $Z_C$=18.89 ohm and 2θ=180°, and a short stub of $Z_A$=300 ohm and θ=90°.

As illustrated in FIG. 7A, it may be verified that in the case of the Doherty combiner according to the present invention, the power is distributed with S31=−3.46 dB and S32=−2.68 dB at a selection frequency (2.34 GHz) which is out of a center frequency (2 GHz). Further, as illustrated in FIG. 7B, it may be verified that in the case of the Doherty combiner according to the present invention, a phase bandwidth between 90±1 has a bandwidth of 20% as 1.9 GHz to 2.1 GHz based on the center frequency (2 GHz).

Third Embodiment

Figure 8:
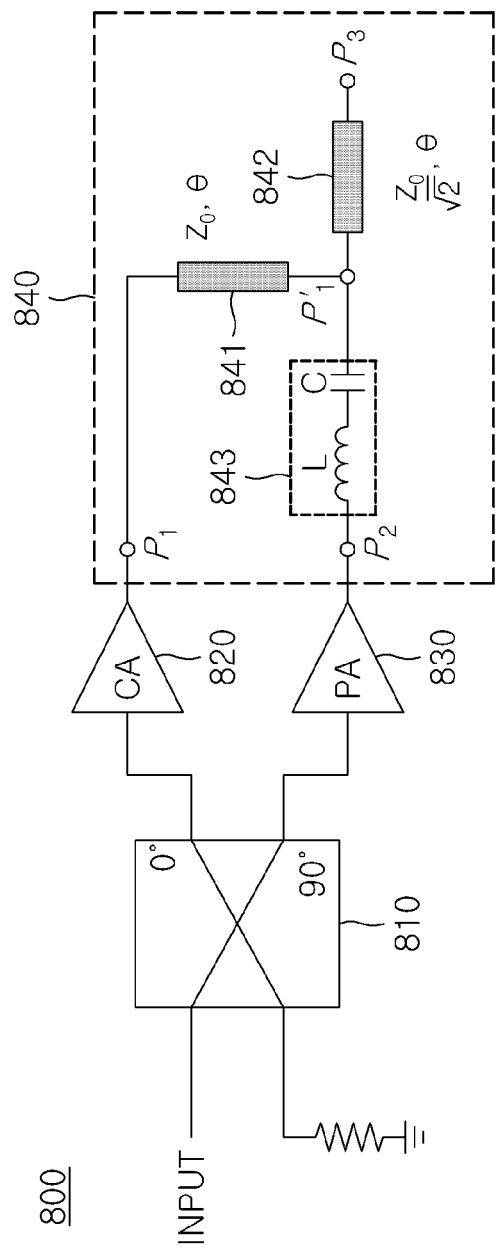
FIG. 8 is a diagram illustrating a configuration of a Doherty power amplifier according to a third embodiment of the present invention.

FIG. 8 is a diagram illustrating a configuration of a Doherty power amplifier according to a third embodiment of the present invention.

Referring to FIG. 8, a Doherty power amplifier 800 according to a third embodiment of the present invention may include a coupler 810, a carrier amplifier 820, a peaking amplifier 830, and a Doherty combiner 840. Since the coupler 810, the carrier amplifier 820, and the peaking amplifier 830 are the same as the coupler 210, the carrier amplifier 220, and the peaking amplifier 230 illustrated in FIG. 2, a detailed description thereof is omitted.

The Doherty combiner 840 according to the present invention may include a first transmission line 841 connected to the output terminal $P_1$ of the carrier amplifier 840, a second transmission line 842 connected to the output terminal $P_3$ of the Doherty power amplifier 800, and a serial resonant circuit 843 connected to the output terminal $P_2$ of the peaking amplifier 830.

The first transmission line 841 may be constituted by a 90° phase shift line for combining the outputs of the carrier amplifier 820 and the peaking amplifier 830. In this case, the first transmission line 841 may have a characteristic impedance of $Z_0$ and an electrical length of $$\theta \left( = \frac{\pi}{2} \frac{f}{f_0} \right).$$

The second transmission line 842 may be constituted by a transmission line for matching the output of the Doherty power amplifier 800. In this case, the second transmission line 842 may have a characteristic impedance of $Z_0/\sqrt{2}$ and an electrical length of $$\theta\left(=\frac{\pi}{2}\frac{f}{f_0}\right).$$

The serial resonant circuit 843 may be constituted by L/C passive elements for improving the bandwidth of the Doherty power amplifier 800. In this case, the inductor L and the capacitor C may be connected to each other in series. Further, the inductor L and the capacitor C may be implemented through the lumped element or a distributed element.

The Doherty combiner 840 may improve a phase difference between an RF signal input from the carrier amplifier 820 and an RF signal input from the peaking amplifier 830 using the serial resonant circuit 843.

In other words, the serial resonant circuit 843 may provide a short circuit at the center frequency $f_0$ and provide a phase difference of approximately 90° between $S_{31}$ and $S_{32}$ in the selection frequency band which is out of the center frequency $f_0$. In order to provide a phase difference of 90° at the selection frequency f other than the center frequency $f_0$, the L and C values of the serial resonant circuit 843 added to the output terminal of the peaking amplifier 830 may be determined. A method for calculating the L and C values will be described below with reference to FIGS. 9A to 9 B below.

Figure 9A:
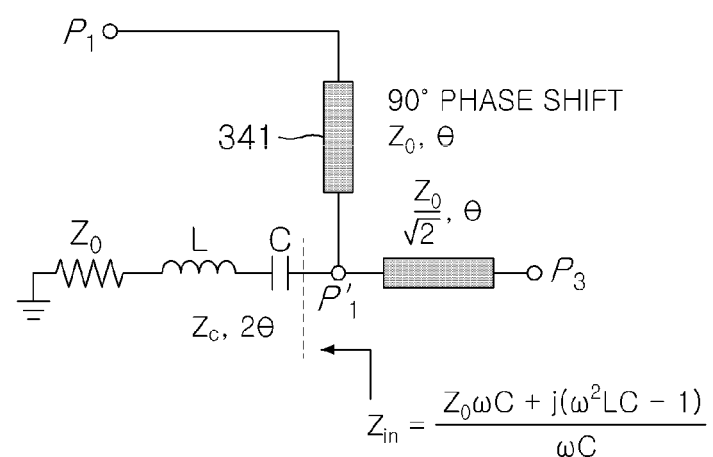
FIGS. 9A to 9B are diagrams illustrating an equivalent circuit for a Doherty combiner 840 of FIG. 8.
Figure 9B:
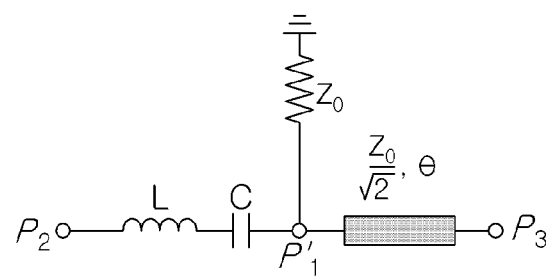

FIGS. 9A to 9B are diagrams illustrating an equivalent circuit for a Doherty power amplifier 800 of FIG. 8.

As illustrated in FIG. 9A, a first equivalent circuit 910 as an equivalent circuit for viewing the phase difference of $S_{31}$ is an equivalent circuit configured by terminating the $p_2$ point of the peaking amplifier 830 to $Z_0$.

In order to view the phase difference of $S_{31}$, a phase $\theta$ from the end $p_1$ of the carrier amplifier 320 to the $p'_1$ point and a phase from the $p'_1$ point to the output terminal $p_3$ of the Doherty power amplifier 800 are summed up.

The phase from the $p'_1$ point to the output terminal $p_3$ of the Doherty power amplifier 800 may be acquired through ABCD-parameters shown in Equation 9 below.

[Equation 9]

$$\begin{bmatrix} A & B \\ C & D \end{bmatrix}_{31'} = \begin{bmatrix} \cos\theta & j\frac{Z_0}{\sqrt{2}}\sin\theta \\ \omega C \frac{j(\omega^2 LC-1)}{(Z_0\omega C)^2 + (\omega^2 LC-1)^2}\cos\theta + \frac{Z_0\omega C -}{(Z_0\omega C)^2 + (\omega^2 LC-1)^2} \\ j\frac{\sqrt{2}}{Z_0}\sin\theta & j\frac{Z_0}{\sqrt{2}}\omega C\frac{j(\omega^2 LC-1)}{(Z_0 C^2)+(\omega^2 LC-1)^2}\sin\theta + \cos\theta \end{bmatrix}$$

Meanwhile, as illustrated in FIG. 9B, a second equivalent circuit 920 as an equivalent circuit for viewing the phase difference of $S_{32}$ is an equivalent circuit configured by terminating the $p_1$ point of the carrier amplifier 820 to $Z_0$.

In order to view the phase difference of $S_{32}$, a phase $\theta$ from the end point $p_2$ of the peaking amplifier 830 to the output terminal $p_3$ of the Doherty power amplifier 800 may be acquired through ABCD-parameters shown in Equation 10 below.

[Equation 10]

$$\begin{bmatrix} A & B \\ C & D \end{bmatrix}_{32} = \begin{bmatrix} \cos\theta + jY_0\frac{\omega^2 LC-1}{\omega C}\cos\theta - \sin\theta j - \frac{Z_0}{\sqrt{2}}\sin\theta - \frac{1}{\sqrt{2}}\frac{\omega^2 LC-1}{\omega C}\sin\theta + \\ \frac{\sqrt{2}}{Z_0}\frac{\omega^2 LC-1}{\omega C} & j\frac{\omega^2 LC-1}{\omega C}\cos\theta \\ Y_0\cos\theta + j\frac{\sqrt{2}}{Z_0}\sin\theta & j\frac{1}{\sqrt{2}}\sin\theta + \cos\theta \end{bmatrix}$$

By using the ABCD-parameters of Equations 9 and 10 described above, it is possible to check the phase of the Doherty combiner 840 according to an embodiment of the present invention. When the carrier amplifier end is used as an input, a phase (i.e., an electrical length $\theta$ of a phase shift line 841) from the $p_1$ point to the $p'_1$ point may be acquired and an output phase $\angle S'_{31}$ from the $p'_1$ point to the $p_3$ point may be acquired through parameter conversion of the ABCD-parameters obtained from Equation 9 described above.

An output phase $\angle S_{31}$ from the carrier amplifier 820 may be acquired by summing up both phases calculated above and the output phase $\angle S_{31}$ may be defined as shown in Equation 11 below.

[Equation 11]

$$\angle S_{31} = \theta + \angle S'_{31}$$

$$\angle S_{31} = \theta - \tan^{-1}\left[\frac{\frac{\sqrt{2}}{2}\{4(Z_0\omega C)^2 + 3(\omega^2 LC-1)^2\}\sin\theta - Z_0\omega C(\omega^2 LC-1)\cos\theta}{\{3(Z_0\omega C)^2 + 2(\omega^2 LC-1)^2\}\cos\theta + \frac{\sqrt{2}}{2}Z_0\omega C(\omega^2 LC-1)\sin\theta}\right]$$

Meanwhile, when the peaking amplifier end is used as the input, the output phase $\angle S_{32}$ from the peaking amplifier 830 corresponds to a phase from the end $p_2$ of the peaking amplifier 830 to the output terminal $p_3$ of the Doherty power amplifier 800. Accordingly, the output phase $\angle S_{32}$ may be defined as shown in Equation 12 below through the parameter conversion of Equation 10 described above.

[Equation 12]

$$\angle S_{32} = -\angle\tan^{-1}\left\{\frac{2Y_0\frac{\omega^2 LC-1}{\omega C}\cos\theta + 2\sqrt{2}\sin\theta}{3\cos\theta - \frac{3\sqrt{2}}{2}Y_0\frac{\omega^2 LC-1}{\omega C}\sin\theta}\right\}$$

Based on Equations 11 and 12 described above, when a phase difference between the output phase $\angle S_{31}$ from the carrier amplifier 820 and the output phase $\angle S_{32}$ the peaking amplifier 830 is $\Phi_{diff}$, $\Phi_{diff}$ may be defined as shown in Equation 13 below.

$$\Phi_{diff} = (\theta + \angle S'_{31}) - \angle S_{32}$$  [Equation 13]

A phase difference $\Phi_o$ at the center frequency $f_0$ and a phase difference $\Phi$ at the selection frequency f which is out of the center frequency $f_0$ may be acquired using Equation 13 described above.

In other words, the phase difference $\Phi_o$ at the center frequency $f_0$ may be defined through Equation 14 below and the phase difference $\Phi$ at the selection frequency f may be defined through Equation 15 below.

$$\Phi_0 = \theta_{f_0} + \angle S'_{31}|_{\theta=\theta_{f_0}} - \angle S_{32}|_{\theta=\theta_{f_0}} \quad \text{[Equation 14]}$$

$$\Phi = \theta_f + \angle S'_{31}|_{\theta=\theta_f} - \angle S_{32}|_{\theta=\theta_f} \quad \text{[Equation 15]}$$

When Equation 15 described above is organized using a condition of $$\theta_{31 f_0} = \frac{\pi}{2}, e_{32f} = \frac{\pi}{2},$$

and $\omega_0^2 LC - 1 = 0$, Equation 16 below may be obtained.

$$\tan^{-1}\left(-\frac{\left(\frac{\omega_f}{\omega_{f_0}}\right)^2 - 1}{Z_0 \omega_f C}\right) = (\Phi_0 - \Phi) - \frac{\pi}{2}\left(1 - \frac{\omega_f}{\omega_{f_0}}\right) \quad \text{[Equation 16]}$$

Last, when the phase difference between $S_{31}$ and $S_{32}$ at the center frequency $f_0$ and the selection frequency f is determined, the capacitor value C of the serial resonant circuit 843 may be obtained using Equation 16 described above and the inductor value L may be obtained by a resonant condition.

Figure 10A:
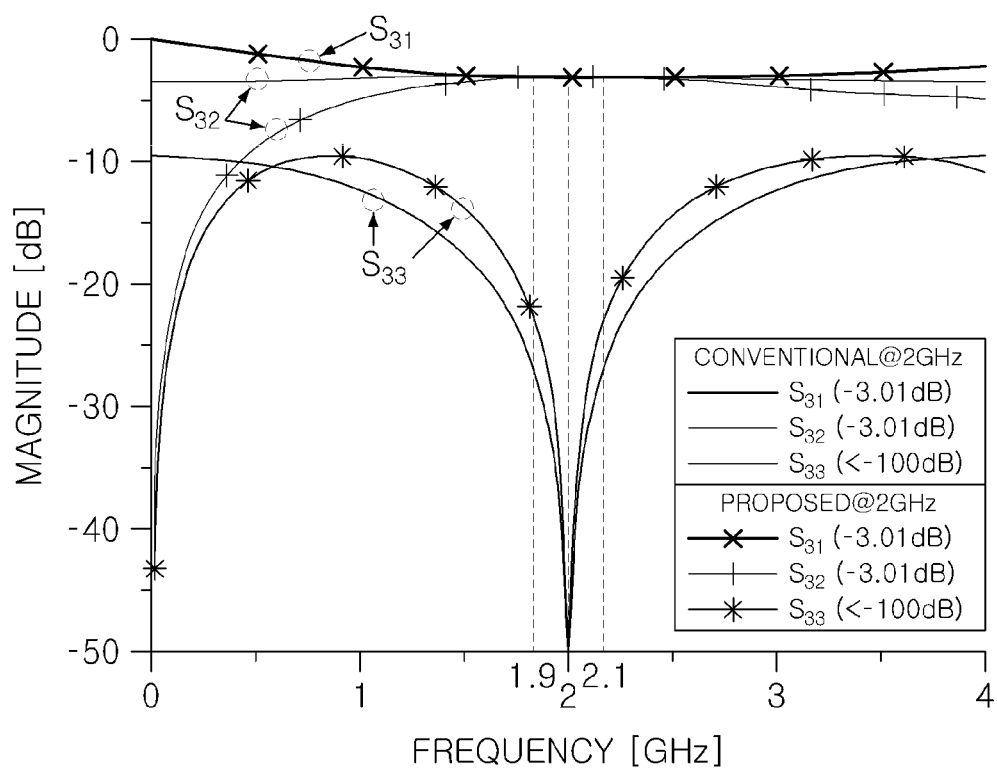
FIGS. 10A to 10B are diagrams illustrating a comparison in performance between the Doherty combiner in the related art and the Doherty combiner of FIG. 8.
Figure 10B:
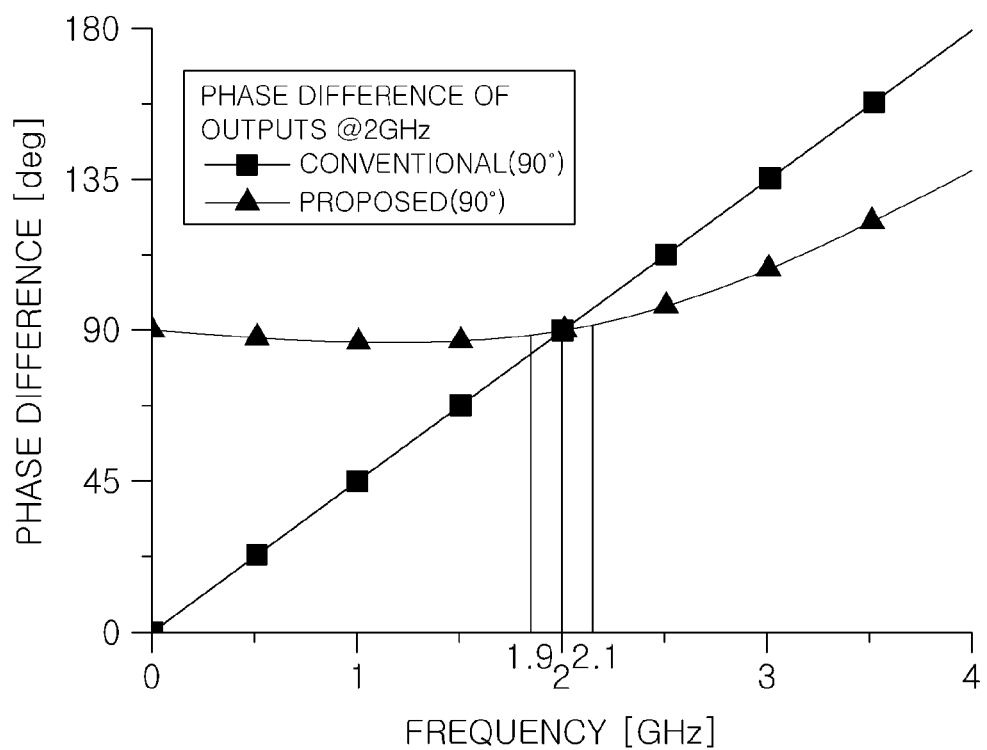

FIGS. 10A and 10B are diagrams illustrating a comparison in performance between the Doherty combiner in the related art and the Doherty combiner of FIG. 8. More specifically, FIG. 10A is a diagram illustrating a result of simulating magnitude characteristics of the Doherty combiner in the related art and the Doherty combiner of the present invention and FIG. 10B is a diagram illustrating a result of simulating phase difference characteristics of the Doherty combiner in the related art and the Doherty combiner of the present invention.

In the simulation, the Doherty combiner according to the present invention is designed with a first transmission line of $Z_0 = 50$ ohm and $\theta = 90°$, a second transmission line of $$\frac{Z_0}{\sqrt{2}} = 35.36 \Omega$$

and $\theta=90°$, and a serial resonant circuit of C=2.671 pF and L=2.371 nH.

As illustrated in FIG. 10A, in both the Doherty combiner in the related art and the Doherty combiner of the present invention, it may be verified that power is distributed with −3.01 dB at the center frequency (2 GHz). Further, as illustrated in FIG. 10B, it may be verified that in the case of the Doherty combiner in the related art, a phase bandwidth between 90±1° from the center frequency (2 GHz) has a narrow bandwidth of 2% as 1.98 GHz to 2.02 GHz, while in the case of the Doherty combiner of the present invention, the phase bandwidth between 90±1° is a wide bandwidth of 9.5% as 1.9 GHz to 2.09 GHz. Accordingly, it may be verified that in the case of the Doherty combiner according to the present invention, the phase bandwidth may be improved in a desired frequency domain and the power is appropriately distributed.

Meanwhile, in the embodiment, when the serial resonant circuit 843 connected to the output terminal $P_2$ of the peaking amplifier 830 is implemented through the distributed element other than the lumped element, a phase φ may be additionally generated during a process of implementing the serial resonant circuit 843. In this case, a phase compensation line (not illustrated) for compensating the phase φ which is additionally generated at the output terminal $P_2$ of the peaking amplifier 830 may be inserted into the output terminal $P_1$ of the carrier amplifier 820. Therefore, the phase difference between the carrier amplifier end and the peaking amplifier end may be maintained to 90°.

Fourth Embodiment

Figure 11:
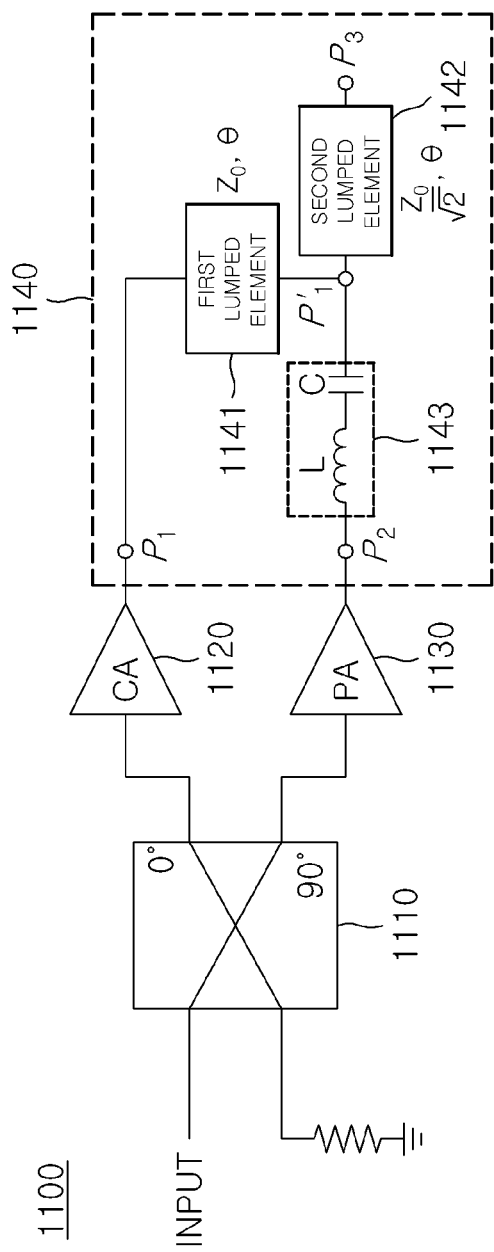
FIG. 11 is a diagram illustrating a configuration of a Doherty power amplifier according to a fourth embodiment of the present invention.
Figure 12A:
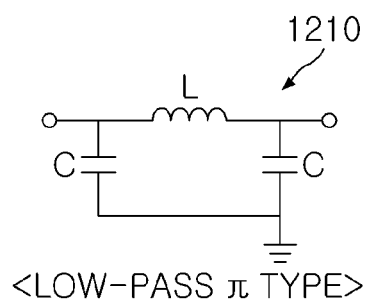
FIGS. 12A to 12D are diagrams referred to for describing four types of a lumped element equivalent to a transmission line.
Figure 12B:
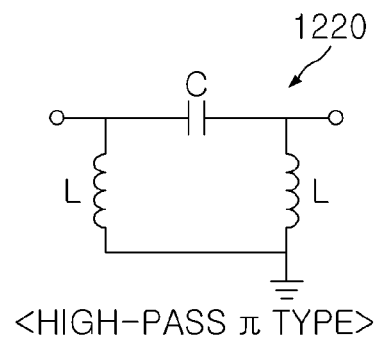
Figure 12C:
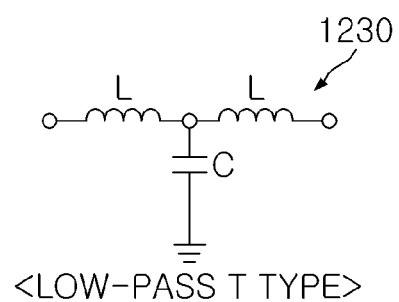
Figure 12D:
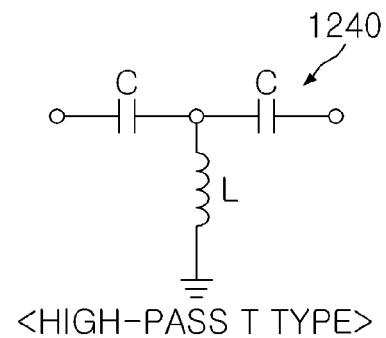

FIG. 11 is a diagram illustrating a configuration of a Doherty power amplifier according to a fourth embodiment of the present invention.

Referring to FIG. 11, a Doherty power amplifier 1100 according to a fourth embodiment of the present invention may include a coupler 1110, a carrier amplifier 1120, a peaking amplifier 1130, and a Doherty combiner 1140. Since the coupler 1110, the carrier amplifier 1120, and the peaking amplifier 1130 are the same as the coupler 210, the carrier amplifier 220, and the peaking amplifier 230 illustrated in FIG. 2, a detailed description thereof is omitted.

The Doherty combiner 1140 according to the present invention may include first lumped elements 1141 connected to the output terminal $P_1$ of the carrier amplifier 1120, second lumped elements 1142 connected to the output terminal $P_3$ of the Doherty power amplifier 1100, and a serial resonant circuit 1143 connected to the output terminal $P_2$ of the peaking amplifier 1130.

Unlike the Doherty combiner 840 of FIG. 8 described above, in the Doherty combiner 1140 according to the present invention, a phase shift section 1141 may be implemented as the first lumped element which is equivalent to the first transmission line. Further, the matching section 1142 may be implemented as the second lumped element which is equivalent to the second transmission line.

By using the first and second lumped elements instead of the first and second transmission lines, the Doherty combiner 1140 and the Doherty power amplifier 1100 including the same may be miniaturized. Further, even though the first and second lumped elements are used instead of the first and second transmission lines, the Doherty combiner 1140 may have the same phase bandwidth and magnitude bandwidth as the Doherty combiner 840 of FIG. 8.

The first lumped element 1141 may perform a phase shift function for combining outputs of the carrier amplifier 1120 and the peaking amplifier 1130. In this case, as illustrated in FIGS. 12A to 12D, the first lumped element 1141 may be configured by any one of a Low-Pass π type LC circuit 1210, a High-Pass π type LC circuit 1220, a Low-Pass T type LC circuit 1230, and a High-Pass T type LC circuit 1240.

The second lumped element 1142 may serve to impedance-match the output of the Doherty power amplifier 1100. Similarly, as illustrated in FIGS. 12A to 12D, the second lumped element 1142 may be configured by any one of the Low-Pass π type LC circuit 1210, the High-Pass π type LC circuit 1220, the Low-Pass T type LC circuit 1230, and the High-Pass T type LC circuit 1240.

Since four LC circuits are available as the first lumped element 1141 and four LC circuits are available as the second lumped element 1142, the Doherty combiner 1140 according to the embodiment may be implemented as a total of 16 types.

As illustrated in FIGS. 13A to 13D, when the first and second lumped elements are π-π type structures, the first and second lumped elements may be constituted by 'Low-Pass π type/Low-Pass π type', 'Low-Pass π type/High-Pass π type', 'High-Pass π type/Low-Pass π type', and 'High-Pass π type/High-Pass π type'.

Further, when the first and second lumped elements are T-T type structures, the first and second lumped elements may be constituted by 'Low-Pass T type/Low-Pass T type', 'Low-Pass T type/High-Pass T type', 'High-Pass T type/Low-Pass T type', and 'High-Pass T type/High-Pass T type'.

Further, when the first and second lumped elements are π-T type structures, the first and second lumped elements may be constituted by 'Low-Pass π type/Low-Pass T type', 'Low-Pass π type/High-Pass T type', 'High-Pass π type/Low-Pass T type', and 'High-Pass π type/High-Pass T type'.

Further, when the first and second lumped elements are T-π type structures, the first and second lumped elements may be constituted by 'Low-Pass T type/Low-Pass π type', 'Low-Pass T type/High-Pass π type', 'High-Pass T type/Low-Pass π type', and 'High-Pass T type/High-Pass π type'. The Doherty combiners having the 16 types will be described in detail with reference to FIGS. 14 to 29 below.

The serial resonant circuit 1143 may be constituted by L/C passive elements for improving the bandwidth of the Doherty power amplifier 1100. In this case, an inductor L and a capacitor C may be connected to each other in series.

The Doherty combiner 1140 may improve a phase difference between an RF signal input from the carrier amplifier 1120 and an RF signal input from the peaking amplifier 1130 by adding the serial resonant circuit 1143 to the output terminal of the peaking amplifier 1130.

Figure 14:
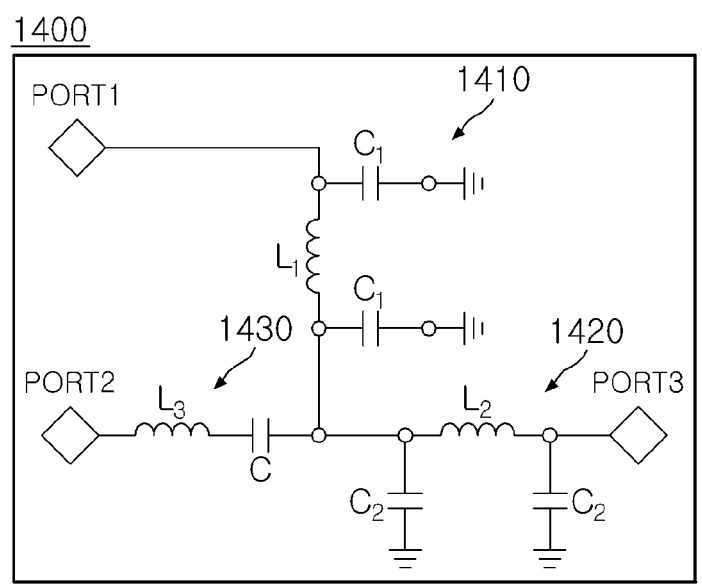
FIGS. 14 to 29 are diagrams referred to for describing a Doherty combiner having 16 types.

FIG. 14 is a diagram illustrating a Doherty combiner 1400 having a Low-Pass π type/Low-Pass π type structure. As illustrated in FIG. 14, the Doherty combiner 1400 may include a first lumped element 1410, a second lumped element 1420, and a serial resonant circuit 1430.

The first lumped element 1410 may be configured by a Low-Pass π type constituted by one inductor $L_1$ and two capacitors $C_1$ and the second lumped element 1420 may be configured by a Low-Pass π type constituted by one inductor $L_2$ and two capacitors $C_2$. The serial resonant circuit 1430 may be constituted by one inductor $L_3$ and one capacitor $C_3$. Here, the L/C values of the first lumped element 1410, the second lumped element 1420, and the serial resonant circuit 1430 may be different from each other.

Figure 15:
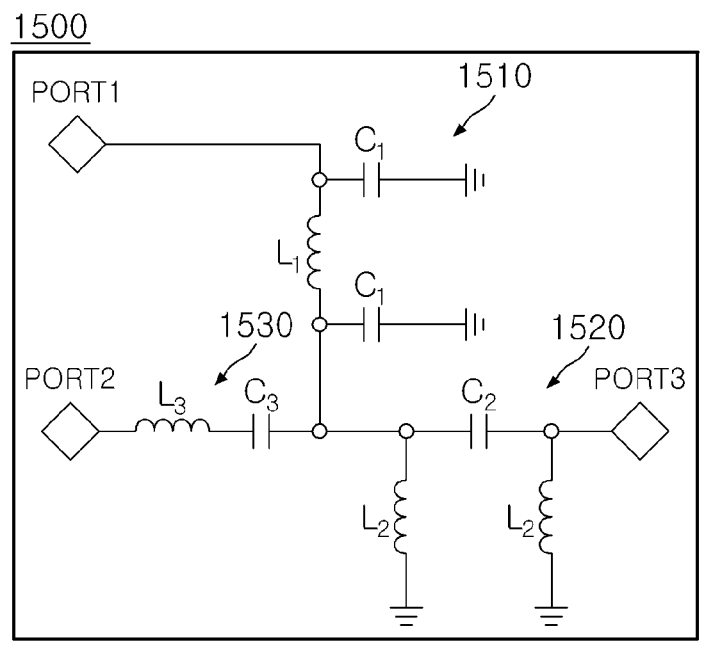

FIG. 15 is a diagram illustrating a Doherty combiner 1500 having a Low-Pass π type/High-Pass π type structure. As illustrated in FIG. 15, the Doherty combiner 1500 may include a first lumped element 1510, a second lumped element 1520, and a serial resonant circuit 1530.

The first lumped element 1510 may be configured by a Low-Pass π type constituted by one inductor $L_1$ and two capacitors $C_1$ and the second lumped element 1520 may be configured by a High-Pass π type constituted by two inductors $L_2$ and one capacitor $C_2$. The serial resonant circuit 1530 may be constituted by one inductor $L_3$ and one capacitor $C_3$. Similarly, the L/C values of the first lumped element 1510, the second lumped element 1520, and the serial resonant circuit 1530 may be different from each other.

Figure 16:
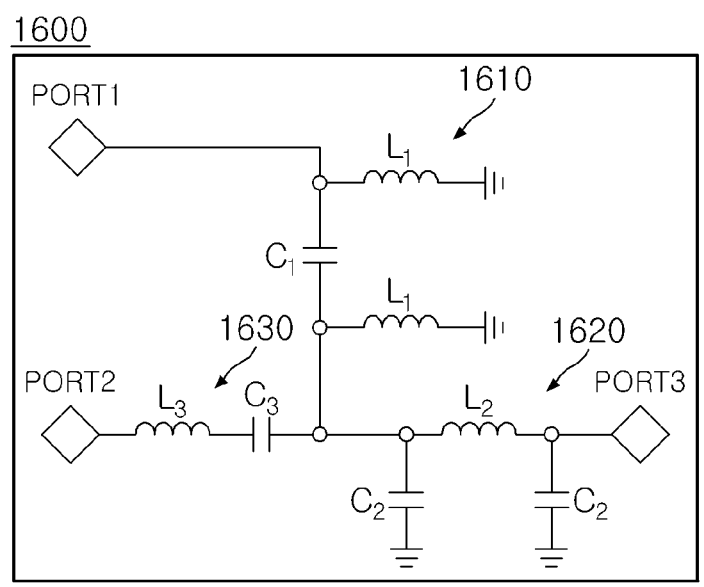

FIG. 16 is a diagram illustrating a Doherty combiner 1600 having a High-Pass type/Low-Pass π type structure. As illustrated in FIG. 16, the Doherty combiner 1600 may include a first lumped element 1610, a second lumped element 1620, and a serial resonant circuit 1630.

The first lumped element 1610 may be configured by a High-Pass π type constituted by two inductors $L_1$ and one capacitor $C_1$ and the second lumped element 1620 may be configured by a Low-Pass π type constituted by one inductor $L_2$ and two capacitors $C_2$. The serial resonant circuit 1630 may be constituted by one inductor $L_3$ and one capacitor $C_3$. Similarly, the L/C values of the first lumped element 1610, the second lumped element 1620, and the serial resonant circuit 1630 may be different from each other.

Figure 17:
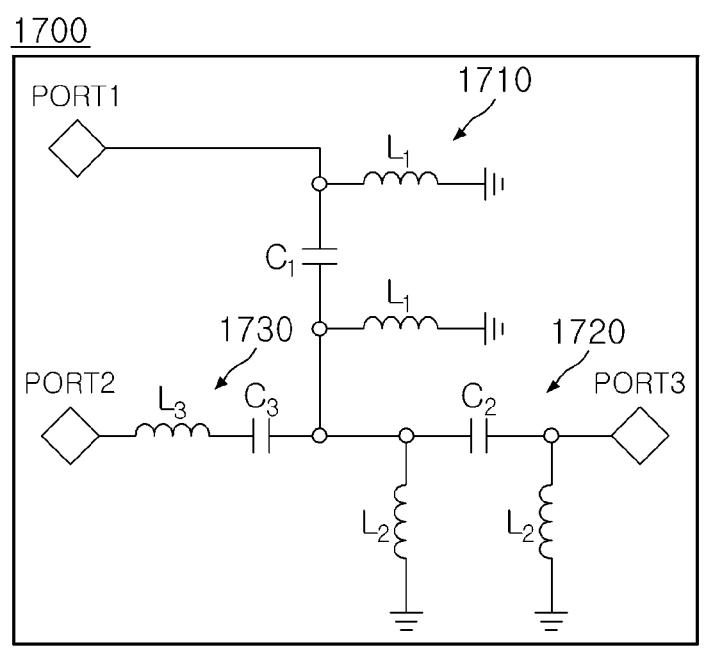

FIG. 17 is a diagram illustrating a Doherty combiner 1700 having a High-Pass π type/High-Pass π type structure. As illustrated in FIG. 17, the Doherty combiner 1700 may include a first lumped element 1710, a second lumped element 1720, and a serial resonant circuit 1730.

The first lumped element 1710 may be configured by a High-Pass π type constituted by two inductors $L_1$ and one capacitor $C_1$ and the second lumped element 1720 may be configured by a High-Pass π type constituted by two inductors $L_2$ and one capacitor $C_2$. The serial resonant circuit 1730 may be constituted by one inductor $L_3$ and one capacitor $C_3$. Similarly, the L/C values of the first lumped element 1710, the second lumped element 1720, and the serial resonant circuit 1730 may be different from each other.

Figure 18:
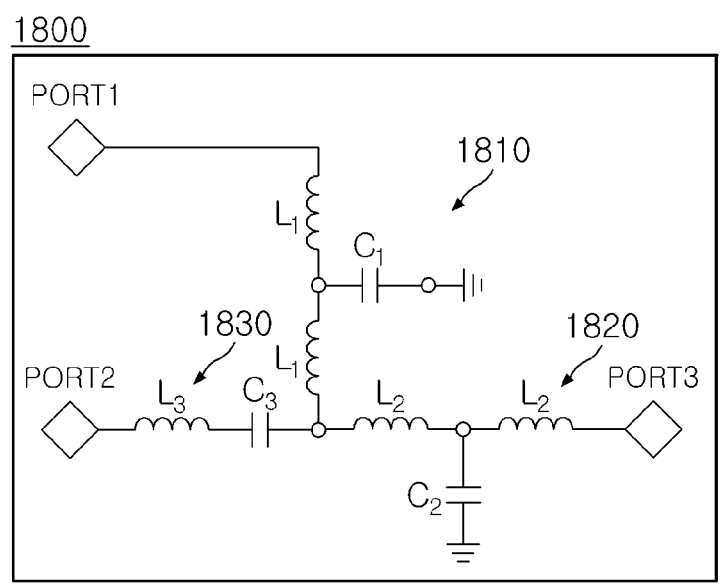

FIG. 18 is a diagram illustrating a Doherty combiner 1800 having a Low-Pass T type/Low-Pass T type structure. As illustrated in FIG. 18, the Doherty combiner 1800 may include a first lumped element 1810, a second lumped element 1820, and a serial resonant circuit 1830.

The first lumped element 1810 may be configured by a Low-Pass T type constituted by two inductors $L_1$ and one capacitor $C_1$ and the second lumped element 1820 may be configured by a Low-Pass T type constituted by two inductors $L_2$ and one capacitor $C_2$. The serial resonant circuit 1830 may be constituted by one inductor $L_3$ and one capacitor $C_3$. Similarly, the L/C values of the first lumped element 1810, the second lumped element 1820, and the serial resonant circuit 1830 may be different from each other.

Figure 19:
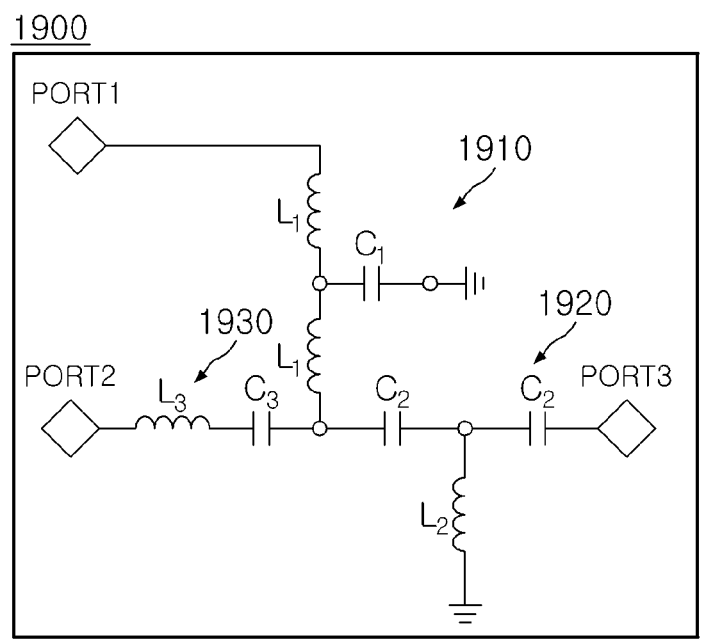

FIG. 19 is a diagram illustrating a Doherty combiner 1900 having a Low-Pass T type/High-Pass T type structure. As illustrated in FIG. 19, the Doherty combiner 1900 may include a first lumped element 1910, a second lumped element 1920, and a serial resonant circuit 1930.

The first lumped element 1910 may be configured by a Low-Pass T type constituted by two inductors $L_1$ and one capacitor $C_1$ and the second lumped element 1920 may be configured by a High-Pass T type constituted by one inductor $L_2$ and two capacitors $C_2$. The serial resonant circuit 1930 may be constituted by one inductor $L_3$ and one capacitor $C_3$. Similarly, the L/C values of the first lumped element 1910, the second lumped element 1920, and the serial resonant circuit 1930 may be different from each other.

Figure 20:
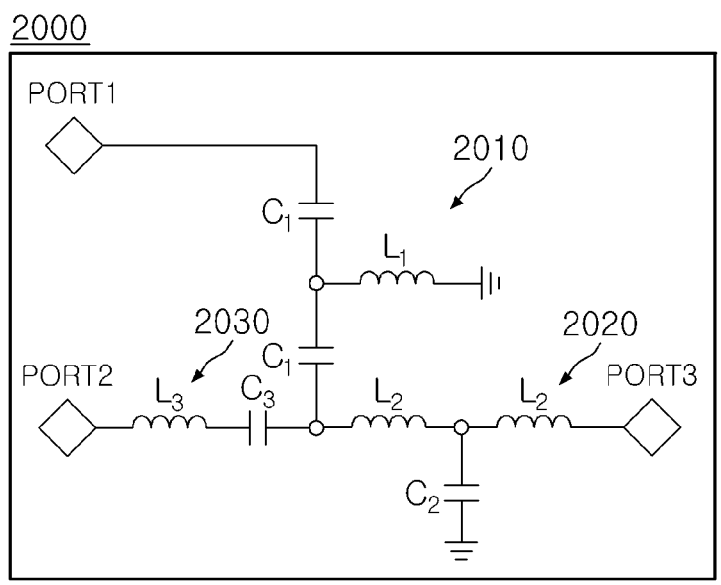

FIG. 20 is a diagram illustrating a Doherty combiner 2000 having a High-Pass T type/Low-Pass T type structure. As illustrated in FIG. 20, the Doherty combiner 2000 may include a first lumped element 2010, a second lumped element 2020, and a serial resonant circuit 2030.

The first lumped element 2010 may be configured by a High-Pass T type constituted by one inductor $L_1$ and two capacitors $C_1$ and the second lumped element 2020 may be configured by a Low-Pass T type constituted by two inductors $L_2$ and one capacitor $C_2$. The serial resonant circuit 2030 may be constituted by one inductor $L_3$ and one capacitor $C_3$. Similarly, the L/C values of the first lumped element 2010, the second lumped element 2020, and the serial resonant circuit 2030 may be different from each other.

Figure 21:
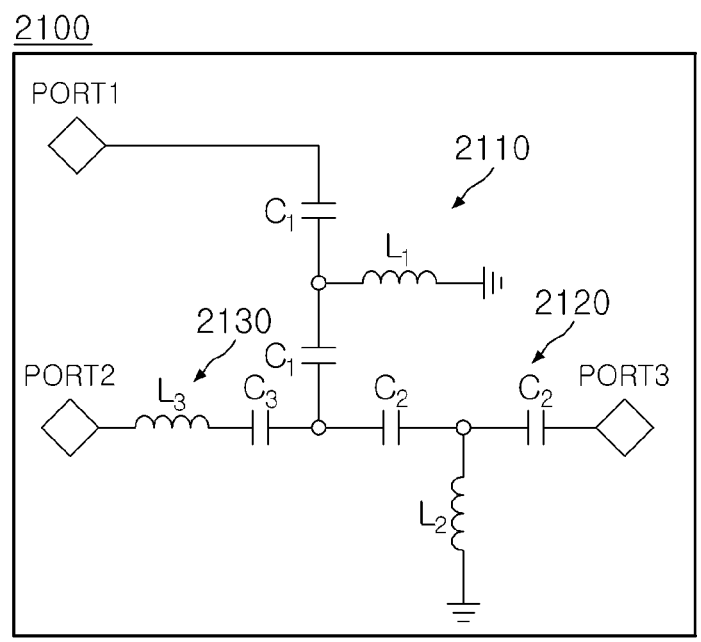

FIG. 21 is a diagram illustrating a Doherty combiner 2100 having a High-Pass T type/High-Pass T type structure. As illustrated in FIG. 21, the Doherty combiner 2100 may include a first lumped element 2110, a second lumped element 2120, and a serial resonant circuit 2130.

The first lumped element 2110 may be configured by a High-Pass T type constituted by one inductor $L_1$ and two capacitors $C_1$ and the second lumped element 2120 may be configured by a High-Pass T type constituted by one inductor $L_2$ and two capacitors $C_2$. The serial resonant circuit 2130 may be constituted by one inductor $L_3$ and one capacitor $C_3$. Similarly, the L/C values of the first lumped element 2110, the second lumped element 2120, and the serial resonant circuit 2130 may be different from each other.

Figure 22:
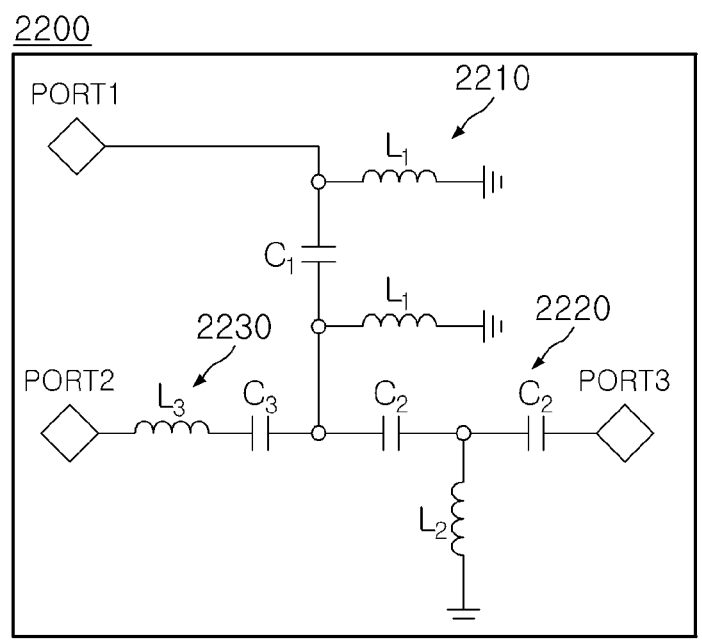

FIG. 22 is a diagram illustrating a Doherty combiner 2200 having a High-Pass π type/High-Pass π type structure. As illustrated in FIG. 22, the Doherty combiner 2200 may include a first lumped element 2210, a second lumped element 2220, and a serial resonant circuit 2230.

The first lumped element 2210 may be configured by a High-Pass π type constituted by two inductors $L_1$ and one capacitor $C_1$ and the second lumped element 2220 may be configured by a High-Pass T type constituted by one inductor $L_2$ and two capacitors $C_2$. The serial resonant circuit 2230 may be constituted by one inductor $L_3$ and one capacitor $C_3$. Similarly, the L/C values of the first lumped element 2210, the second lumped element 2220, and the serial resonant circuit 2230 may be different from each other.

Figure 23:
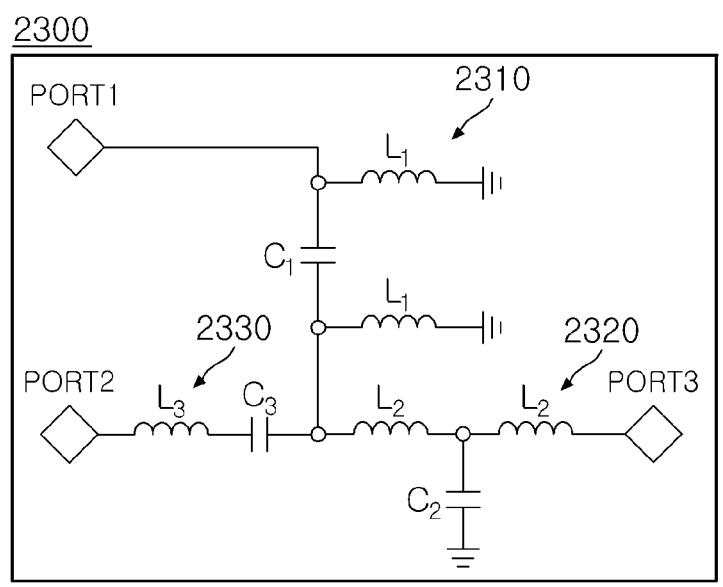

FIG. 23 is a diagram illustrating a Doherty combiner 2300 having a High-Pass π type/Low-Pass T type structure. As illustrated in FIG. 23, the Doherty combiner 2300 may include a first lumped element 2310, a second lumped element 2320, and a serial resonant circuit 2330.

The first lumped element 2310 may be configured by a High-Pass π type constituted by two inductors $L_1$ and one capacitor $C_1$ and the second lumped element 2320 may be configured by a Low-Pass T type constituted by two inductors $L_2$ and one capacitor $C_2$. The serial resonant circuit 2330 may be constituted by one inductor $L_3$ and one capacitor $C_3$.

Figure 24:
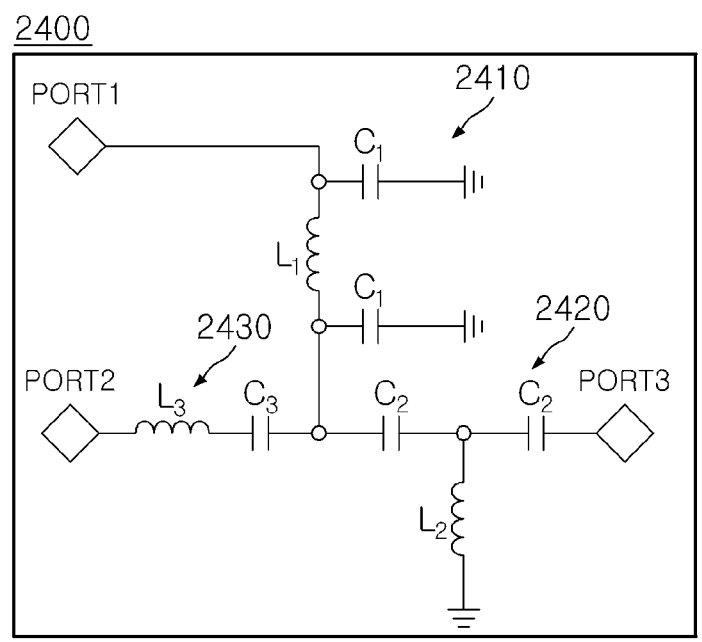

FIG. 24 is a diagram illustrating a Doherty combiner 2400 having a Low-Pass π type/High-Pass T type structure. As illustrated in FIG. 24, the Doherty combiner 2400 may include a first lumped element 2410, a second lumped element 2420, and a serial resonant circuit 2430.

The first lumped element 2410 may be configured by a Low-Pass π type constituted by one inductor $L_1$ and two capacitors $C_1$ and the second lumped element 2420 may be configured by a High-Pass T type constituted by one inductor $L_2$ and two capacitors $C_2$. The serial resonant circuit 2430 may be constituted by one inductor $L_3$ and one capacitor $C_3$. Similarly, the L/C values of the first lumped element 2410, the second lumped element 2420, and the serial resonant circuit 2430 may be different from each other.

Figure 25:
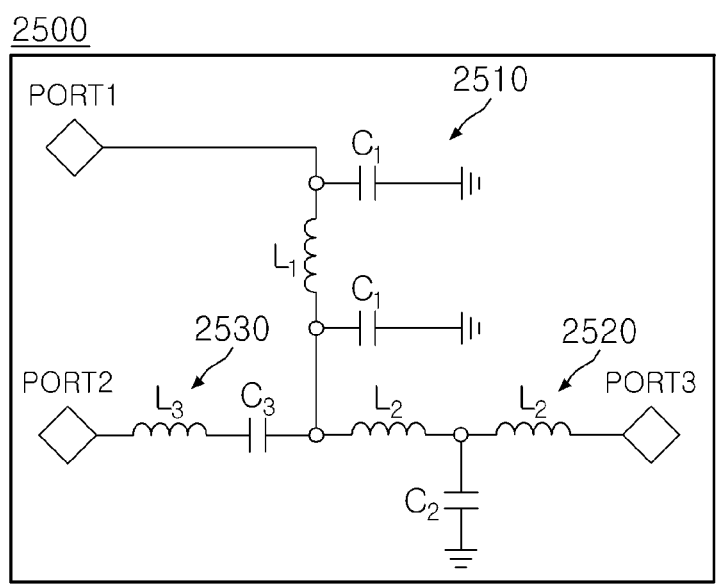

FIG. 25 is a diagram illustrating a Doherty combiner 2500 having a Low-Pass π type/Low-Pass T type structure. As illustrated in FIG. 25, the Doherty combiner 2500 may include a first lumped element 2510, a second lumped element 2520, and a serial resonant circuit 2530.

The first lumped element 2510 may be configured by a Low-Pass π type constituted by one inductor $L_1$ and two capacitors $C_1$ and the second lumped element 2520 may be configured by a Low-Pass T type constituted by two inductors $L_2$ and one capacitor $C_2$. The serial resonant circuit 2530 may be constituted by one inductor $L_3$ and one capacitor $C_3$. Similarly, the L/C values of the first lumped element 2510, the second lumped element 2520, and the serial resonant circuit 2530 may be different from each other.

Figure 26:
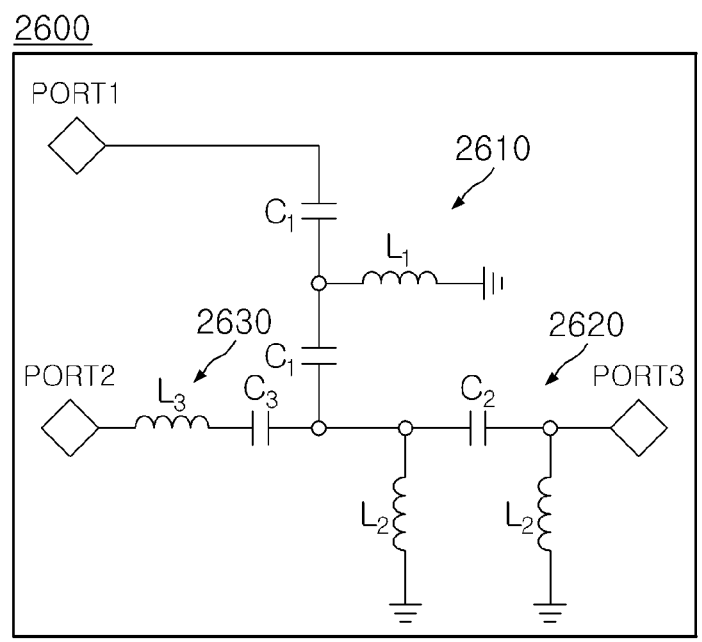

FIG. 26 is a diagram illustrating a Doherty combiner 2600 having a High-Pass T type/High-Pass π type structure. As illustrated in FIG. 26, the Doherty combiner 2600 may include a first lumped element 2610, a second lumped element 2620, and a serial resonant circuit 2630.

The first lumped element 2610 may be configured by a High-Pass T type constituted by one inductor $L_1$ and two capacitors $C_1$ and the second lumped element 2620 may be configured by a High-Pass π type constituted by two inductors $L_2$ and one capacitor $C_2$. The serial resonant circuit 2630 may be constituted by one inductor $L_3$ and one capacitor $C_3$. Similarly, the L/C values of the first lumped element 2610, the second lumped element 2620, and the serial resonant circuit 2630 may be different from each other.

Figure 27:
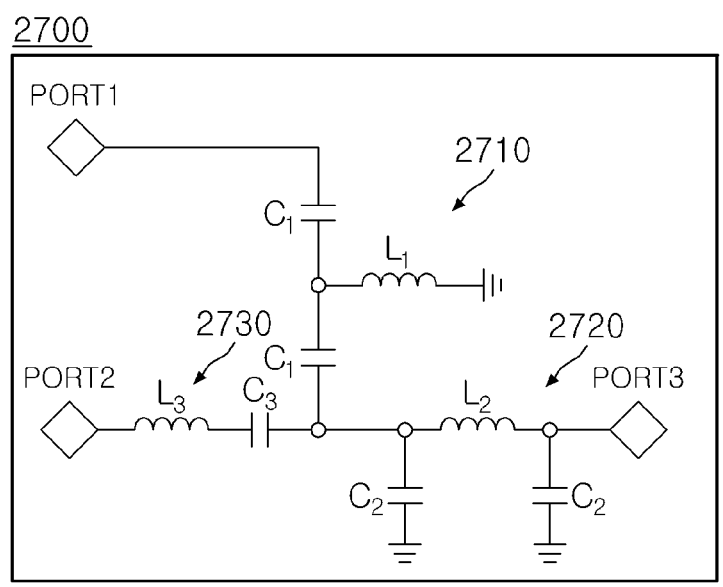

FIG. 27 is a diagram illustrating a Doherty combiner 2700 having a High-Pass T type/Low-Pass π type structure. As illustrated in FIG. 27, the Doherty combiner 2700 may include a first lumped element 2710, a second lumped element 2720, and a serial resonant circuit 2730.

The first lumped element 2710 may be configured by a High-Pass T type constituted by one inductor $L_1$ and two capacitors $C_1$ and the second lumped element 2720 may be configured by a Low-Pass π type constituted by one inductor $L_2$ and two capacitors $C_2$. The serial resonant circuit 2730 may be constituted by one inductor $L_3$ and one capacitor $C_3$. Similarly, the L/C values of the first lumped element 2710, the second lumped element 2720, and the serial resonant circuit 2730 may be different from each other.

Figure 28:
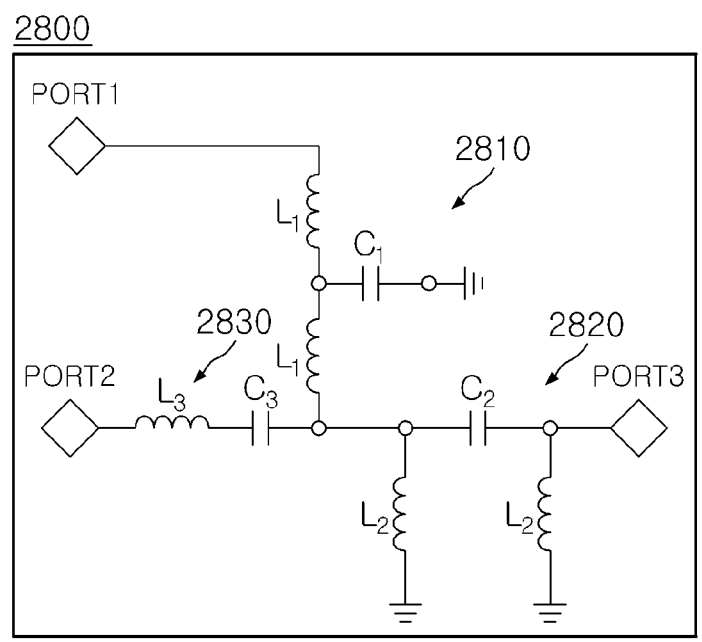

FIG. 28 is a diagram illustrating a Doherty combiner 2800 having a Low-Pass T type/High-Pass π type structure. As illustrated in FIG. 28, the Doherty combiner 2800 may include a first lumped element 2810, a second lumped element 2820, and a serial resonant circuit 2830.

The first lumped element 2810 may be configured by a Low-Pass T type constituted by two inductors $L_1$ and one capacitor $C_1$ and the second lumped element 2820 may be configured by a High-Pass π type constituted by two inductors $L_2$ and one capacitor $C_2$. The serial resonant circuit 2830 may be constituted by one inductor $L_3$ and one capacitor $C_3$. Similarly, the L/C values of the first lumped element 2810, the second lumped element 2820, and the serial resonant circuit 2830 may be different from each other.

Figure 29:
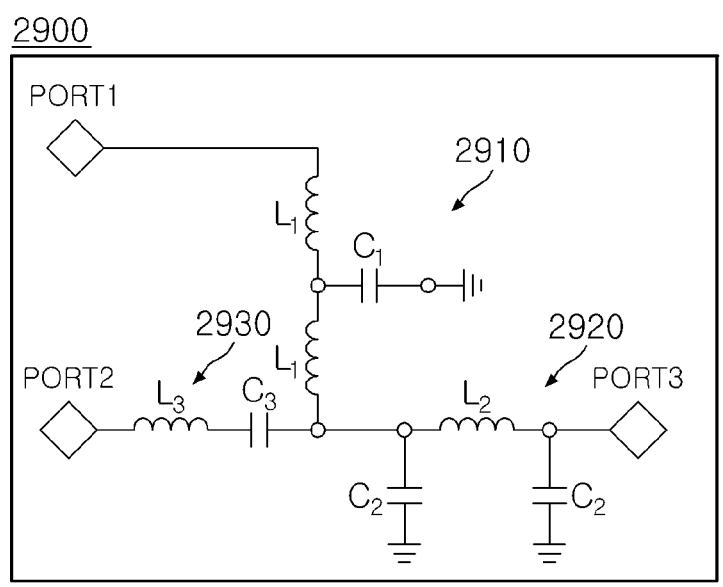

FIG. 29 is a diagram illustrating a Doherty combiner 2900 having a Low-Pass T type/Low-Pass π type structure. As illustrated in FIG. 29, the Doherty combiner 2900 may include a first lumped element 2910, a second lumped element 2920, and a serial resonant circuit 2930.

The first lumped element 2910 may be configured by a Low-Pass T type constituted by two inductors $L_1$ and one capacitor $C_1$ and the second lumped element 2920 may be configured by a Low-Pass π type constituted by one inductor $L_2$ and two capacitors $C_2$. The serial resonant circuit 2930 may be constituted by one inductor $L_3$ and one capacitor $C_3$. Similarly, the L/C values of the first lumped element 2910, the second lumped element 2920, and the serial resonant circuit 2930 may be different from each other.

Fifth Embodiment

Figure 30A:
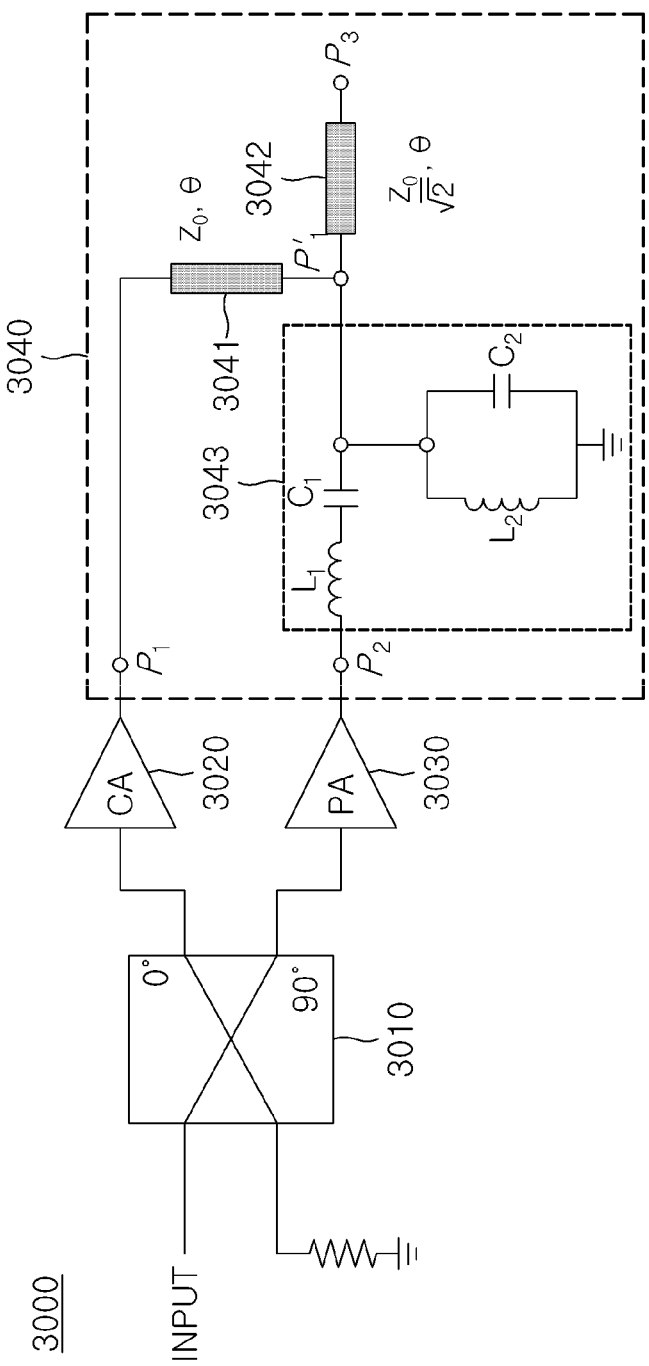
FIGS. 30A and 30B are diagrams illustrating a configuration of a Doherty power amplifier according to a fifth embodiment of the present invention.
Figure 30B:
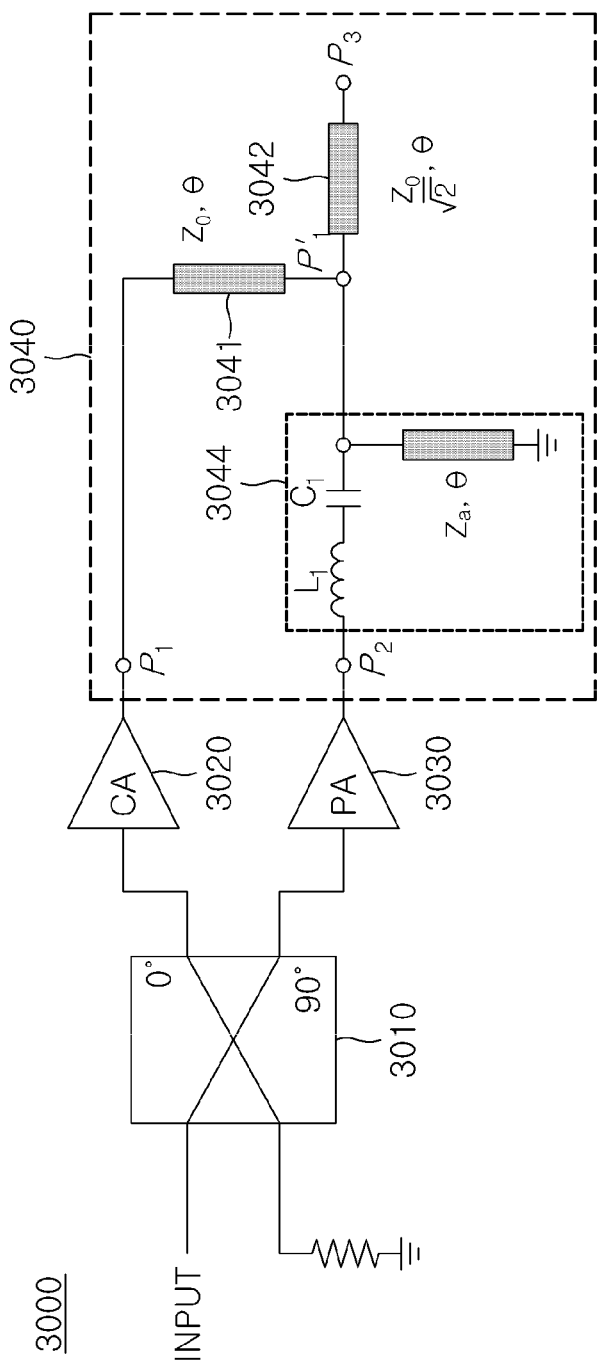

FIGS. 30A and 30B are diagrams illustrating a configuration of a Doherty power amplifier according to a fifth embodiment of the present invention.

Referring to FIGS. 30A and 30B, a Doherty power amplifier 3000 according to a fifth embodiment of the present invention may include a coupler 3010, a carrier amplifier 3020, a peaking amplifier 3030, and a Doherty combiner 3040. Since the coupler 3010, the carrier amplifier 3020, and the peaking amplifier 3030 are the same as the coupler 210, the carrier amplifier 220, and the peaking amplifier 230 illustrated in FIG. 2, a detailed description thereof is omitted.

As an embodiment, as illustrated in FIG. 30A, the Doherty combiner 3040 according to the present invention may include a first transmission line 3041 connected to the output terminal $P_1$ of the carrier amplifier 3020, a second transmission line 3042 connected to the output terminal $P_3$ of the Doherty power amplifier 3000, and a first bandwidth improvement section 3043 connected to the output terminal $P_2$ of the peaking amplifier 3030. In this case, the first bandwidth improvement section 3043 may be constituted by the serial resonant circuit and the parallel resonant circuit.

As another embodiment, as illustrated in FIG. 30B, the Doherty combiner 3040 according to the present invention may include a first transmission line 3041 connected to the output terminal $P_1$ of the carrier amplifier 3020, a second transmission line 3042 connected to the output terminal $P_3$ of the Doherty power amplifier 3000, and a second bandwidth improvement section 3044 connected to the output terminal $P_2$ of the peaking amplifier 3030. In this case, the second bandwidth improvement section 3044 may be constituted by the serial resonant circuit and the third transmission line.

The first transmission line 3041 may be constituted by a 90° phase shift line for combining the outputs of the carrier amplifier 3020 and the peaking amplifier 3030. In this case, the first transmission line 3041 may have a characteristic impedance of $Z_0$ and an electrical length of $$\theta\left(=\frac{\pi}{2}\frac{f}{f_0}\right).$$

The second transmission line 3042 may be constituted by a transmission line for matching the output of the Doherty power amplifier 3000. In this case, the second transmission line 3042 may have a characteristic impedance of $Z_0/\sqrt{2}$ and an electrical length of $$\theta\left(=\frac{\pi}{2}\frac{f}{f_0}\right).$$

The serial resonant circuit of the first bandwidth improvement section 3043 may be constituted by L/C passive elements for improving the phase bandwidth of the Doherty power amplifier 3000. In this case, the inductor $L_1$ and the capacitor $C_1$ may be connected to each other in series.

The parallel resonant circuit of the first bandwidth improvement section 3043 may be constituted by L/C passive elements for improving the magnitude bandwidth of the Doherty power amplifier 3000. In this case, the inductor $L_2$ and the capacitor $C_2$ may be connected to each other in parallel. The $L_2$ and $C_2$ values of the parallel resonant circuit are irrespective of the $L_1$ and $C_1$ values of the serial resonant circuit (however, both values may be the same as each other.

The serial resonant circuit of the second bandwidth improvement section 3044 may be constituted by L/C passive elements for improving the phase bandwidth of the Doherty power amplifier 3000. In this case, the inductor $L_1$ and the capacitor $C_1$ may be connected to each other in series.

The third transmission line of the second bandwidth improvement section 3044 may be configured by a short stub which is an equivalent circuit to the parallel resonant circuit of the first bandwidth improvement section 3043. In this case, the third transmission line 645 may have a characteristic impedance of $Z_a$ and an electrical length of $$\theta\left(=\frac{\pi}{2}\frac{f}{f_0}\right).$$

The characteristic impedance $Z_a$ may be defined through an equation ($Z_a$=⅛ fC).

The Doherty combiner 3040 illustrated in FIG. 30A adds the serial resonant circuit to the output terminal $P_2$ of the peaking amplifier 3030 to improve the phase bandwidth of the Doherty power amplifier 3000. Further, the Doherty combiner 3040 adds the parallel resonant circuit to the output terminal $P_2$ of the peaking amplifier 3030 to improve the magnitude bandwidth of the Doherty power amplifier 3000.

Similarly, the Doherty combiner 3040 illustrated in FIG. 30B adds the serial resonant circuit to the output terminal $P_2$ of the peaking amplifier 3030 to improve the phase bandwidth of the Doherty power amplifier 3000. Further, the Doherty combiner 3040 adds the short stub to the output terminal $P_2$ of the peaking amplifier 3030 to improve the magnitude bandwidth of the Doherty power amplifier 3000.

Figure 31A:
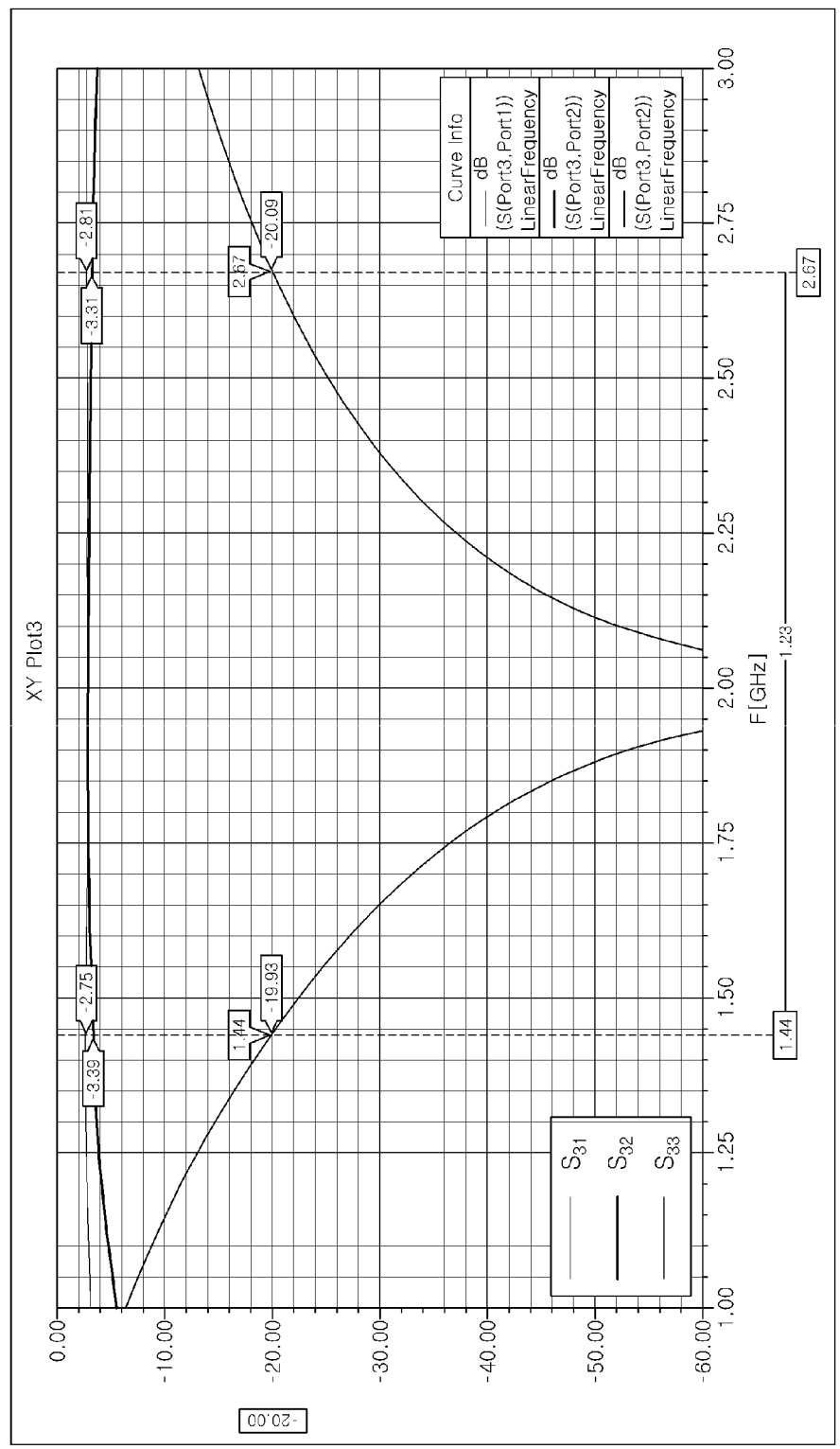
FIG. 31A is a diagram illustrating a result of simulating a magnitude characteristic of the Doherty combiner of FIG. 30A.
Figure 31B:
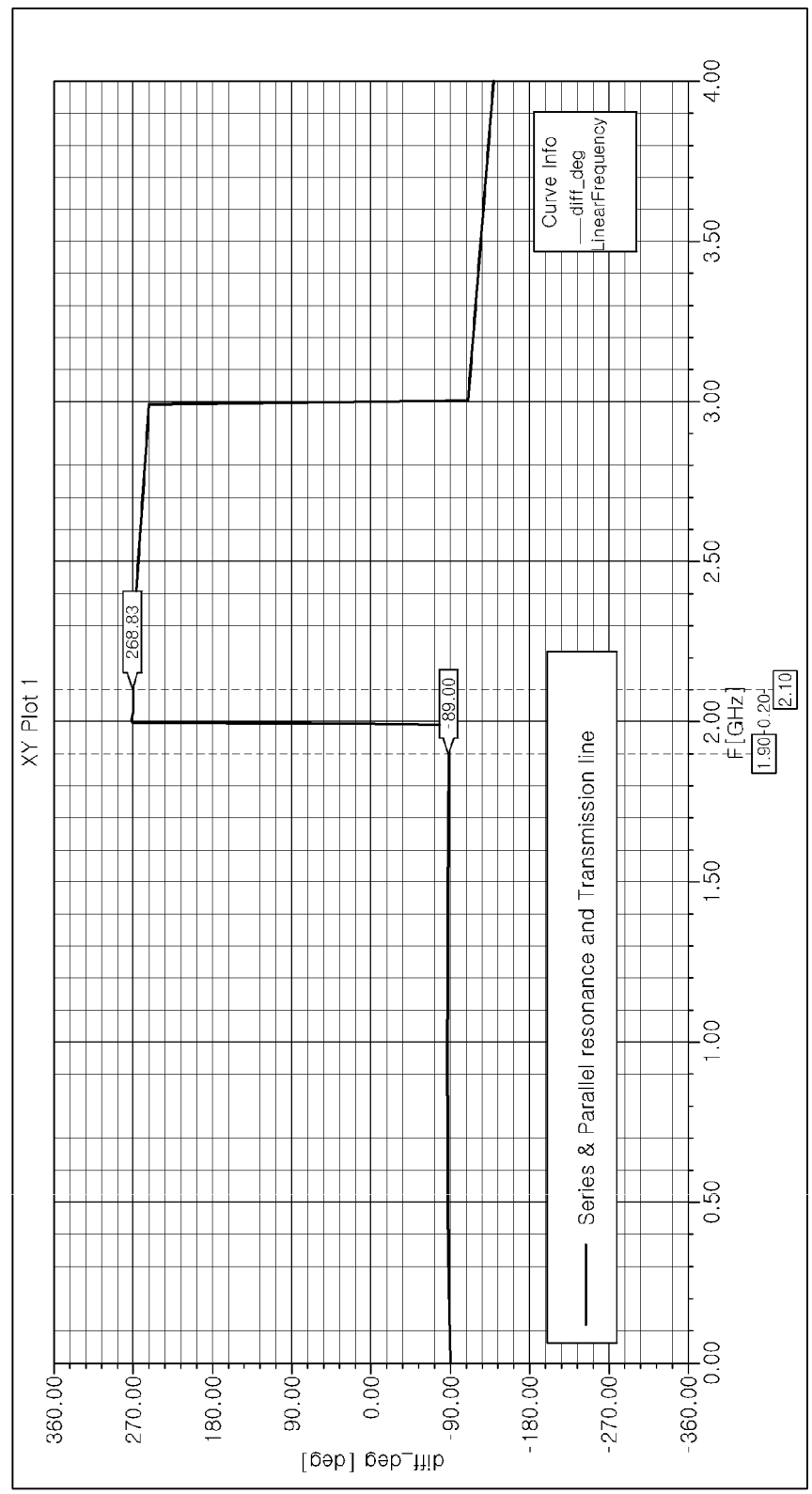
FIG. 31B is a diagram illustrating a result of simulating a phase difference characteristic of the Doherty combiner of FIG. 30A.

FIG. 31A is a diagram illustrating a result of simulating the magnitude characteristic of the Doherty combiner 30A and FIG. 31B is a diagram illustrating a result of simulating the phase difference characteristic of the Doherty combiner of FIG. 30A.

In the simulation, the Doherty combiner according to the present invention is designed with a first transmission line of $Z_0$=50 ohm and θ=90°, a second transmission line of $Z_0/\sqrt{2}$=35.35 ohm and θ=90°, a serial resonant circuit of L=2.3712 nH and C=C=2.671 pF, and a parallel resonant circuit of L=2.3712 nH, C=C=2.671 pF.

As illustrated in FIG. 31A, it may be verified that in the case of the Doherty combiner according to the present invention, the magnitude bandwidth increases to 760 MHz as compared with the Doherty combiner using only the serial resonant circuit. Further, as illustrated in FIG. 31B, it may be verified that the Doherty combiner according to the present invention, the magnitude bandwidth has the same phase difference as the Doherty combiner using only the serial resonant circuit.

In other words, it may be verified that the parallel resonant circuit is added to the serial resonant circuit provided in the Doherty combiner 800 of FIG. 8 described above to improve the magnitude bandwidth of the corresponding amplifier while maintaining the phase bandwidth of the Doherty power amplifier.

Sixth Embodiment

Figure 32:
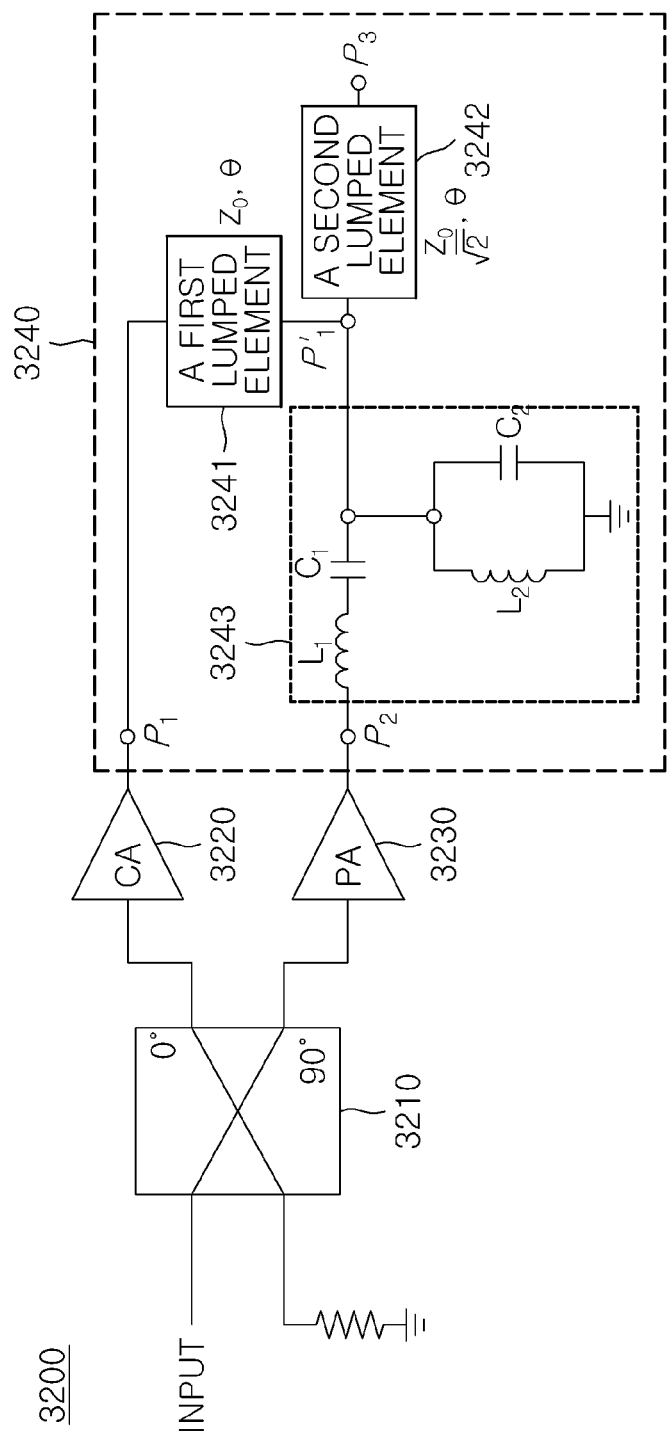
FIG. 32 is a diagram illustrating a configuration of a Doherty power amplifier according to a sixth embodiment of the present invention.
Figure 33A:
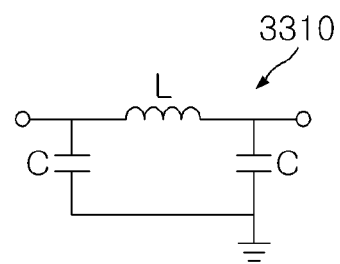
FIGS. 33A to 33D are diagrams referred to for describing four types of a lumped element equivalent to a transmission line.
Figure 33B:
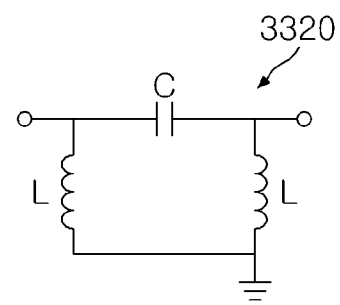
Figure 33C:
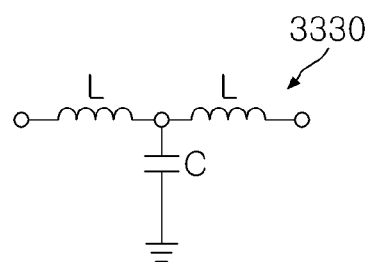
Figure 33D:
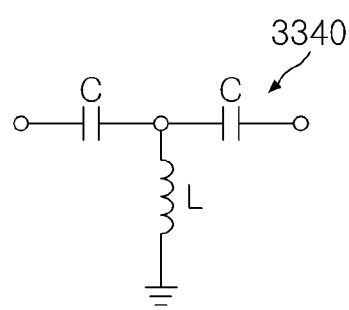

FIG. 32 is a diagram illustrating a configuration of a Doherty power amplifier according to a sixth embodiment of the present invention.

Referring to FIG. 32, a Doherty power amplifier 3200 according to a sixth embodiment of the present invention may include a coupler 3210, a carrier amplifier 3220, a peaking amplifier 3230, and a Doherty combiner 3240. Since the coupler 3210, the carrier amplifier 3220, and the peaking amplifier 3230 are the same as the coupler 210, the carrier amplifier 220, and the peaking amplifier 230 illustrated in FIG. 2, a detailed description thereof is omitted.

The Doherty combiner 3240 according to the present invention may include first lumped elements 3241 connected to the output terminal $P_1$ of the carrier amplifier 3240, a second lumped element 3242 connected to the output terminal $P_3$ of the Doherty power amplifier 3200, and a bandwidth improvement section 3243 connected to the output terminal $P_2$ of the peaking amplifier 3230. In this case, the bandwidth improvement section 3243 may be constituted by the serial resonant circuit and the parallel resonant circuit.

Unlike the Doherty combiner 3040 of FIG. 30 described above, in the Doherty combiner 3240 according to the present invention, a phase shift section 3241 may be implemented as the first lumped element which is equivalent to the first transmission line. Further, the matching section 3242 may be implemented as the second lumped element which is equivalent to the second transmission line.

By using the first and second lumped elements instead of the first and second transmission lines, the Doherty combiner 3240 and the Doherty power amplifier 3200 including the same may be miniaturized. Further, even though the first and second lumped elements are used instead of the first and second transmission lines, the Doherty combiner 3240 may have the same phase bandwidth and magnitude bandwidth as the Doherty combiner 3040 of FIG. 30.

The first lumped element 3241 may perform a phase shift function for combining outputs of the carrier amplifier 3220 and the peaking amplifier 3230. In this case, as illustrated in FIGS. 33A to 33D, the first lumped element 3241 may be configured by any one of a Low-Pass π type LC circuit 3310, a High-Pass π type LC circuit 3320, a Low-Pass T type LC circuit 3330, and a High-Pass T type LC circuit 3340.

The second lumped element 3242 may serve to impedance-match the output of the Doherty power amplifier 3200. Similarly, as illustrated in FIGS. 33A to 33D, the second lumped element 3242 may be configured by any one of a Low-Pass π type LC circuit 3310, a High-Pass π type LC circuit 3320, a Low-Pass T type LC circuit 3330, and a High-Pass T type LC circuit 3340.

Since four types of circuits are available as the first lumped element 3241 and four types of circuits are available as the second lumped element 3242, the Doherty combiner 3240 according to the embodiment may be implemented as a total of 16 types.

As illustrated in FIGS. 34A to 34D when the first and second lumped elements are π-π type structures, the first and second lumped elements may be constituted by 'Low-Pass π type/Low-Pass π type', 'Low-Pass π type/High-Pass π type', 'High-Pass π type/Low-Pass π type', and 'High-Pass π type/High-Pass π type'.

Further, when the first and second lumped elements are T-T type structures, the first and second lumped elements may be constituted by 'Low-Pass T type/Low-Pass T type', 'Low-Pass T type/High-Pass T type', 'High-Pass T type/Low-Pass T type', and 'High-Pass T type/High-Pass T type'.

Further, when the first and second lumped elements are π-T type structures, the first and second lumped elements may be constituted by 'Low-Pass π type/Low-Pass T type', 'Low-Pass π type/High-Pass T type', 'High-Pass π type/Low-Pass T type', and 'High-Pass π type/High-Pass T type'.

Further, when the first and second lumped elements are T-π type structures, the first and second lumped elements may be constituted by 'Low-Pass T type/Low-Pass π type', 'Low-Pass T type/High-Pass π type', 'High-Pass T type/Low-Pass π type', and 'High-Pass T type/High-Pass π type'.

The serial resonant circuit of the bandwidth improvement section 3243 may be constituted by L/C passive elements for improving the phase bandwidth of the Doherty power amplifier 3200. In this case, the inductor $L_1$ and the capacitor $C_1$ may be connected to each other in series.

The parallel resonant circuit of the bandwidth improvement section 3243 may be constituted by L/C passive elements for improving the magnitude bandwidth of the Doherty power amplifier 3200. In this case, the inductor $L_2$ and the capacitor $C_2$ may be connected to each other in series. The $L_2$ and $C_2$ values of the parallel resonant circuit are irrespective of the $L_1$ and $C_1$ values of the serial resonant circuit (however, both values may have the same as each other).

The Doherty combiner 3240 adds the serial resonant circuit to the output terminal $P_2$ of the peaking amplifier 3230 to improve the phase bandwidth of the Doherty power amplifier 3200. Further, the Doherty combiner 3240 adds the parallel resonant circuit to the output terminal $P_2$ of the peaking amplifier 3230 to improve the magnitude bandwidth of the Doherty power amplifier 3200.

Seventh Embodiment

Figure 35:
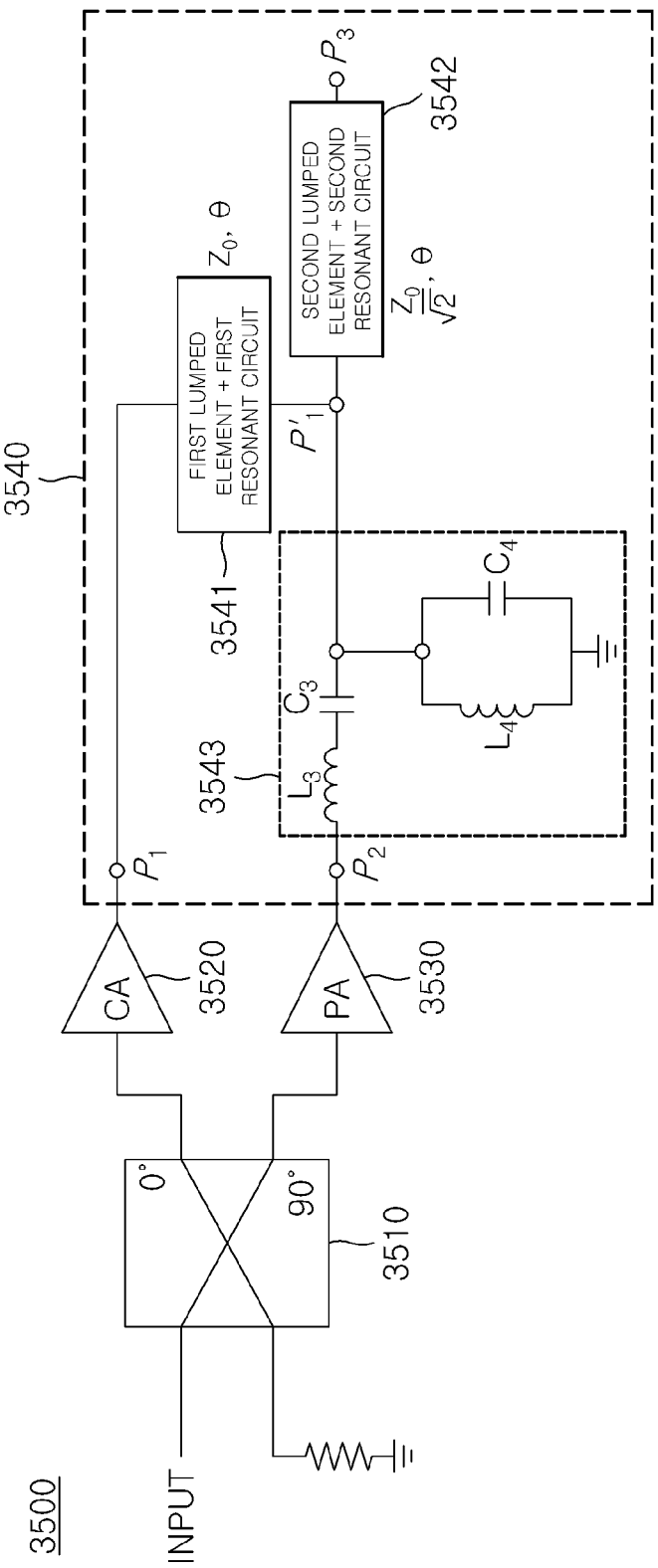
FIG. 35 is a diagram illustrating a configuration of a Doherty power amplifier according to a seventh embodiment of the present invention.
Figure 36A:
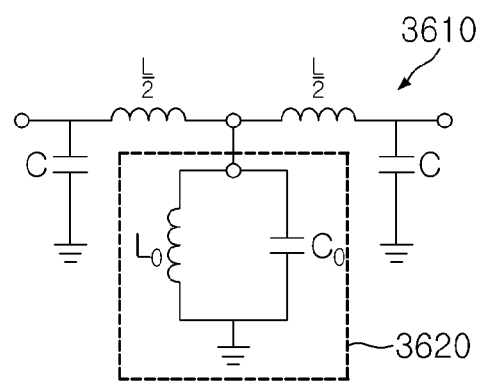
FIGS. 36A to 36D are diagrams referred to for describing four types of lumped elements and resonant circuits provided in the Doherty power amplifier of FIG. 35.
Figure 36B:
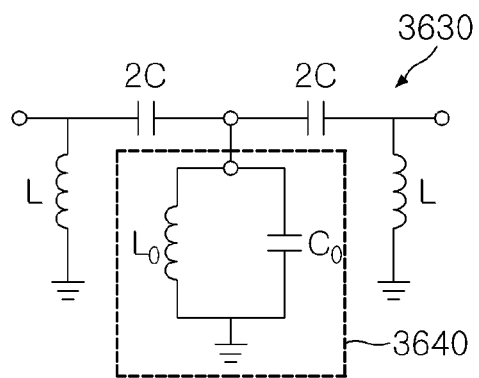
Figure 36C:
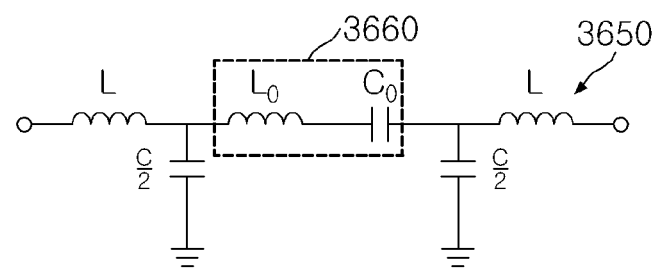
Figure 36D:
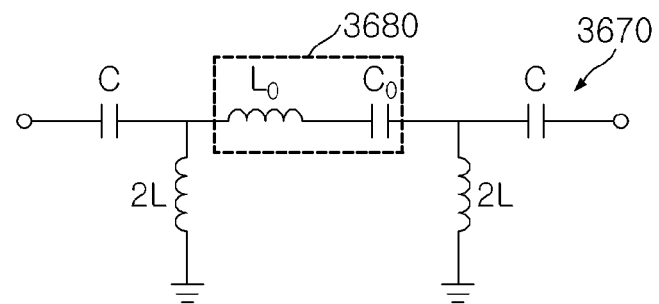

FIG. 35 is a diagram illustrating a configuration of a Doherty power amplifier according to a seventh embodiment of the present invention.

Referring to FIG. 35, a Doherty power amplifier 3500 according to a seventh embodiment of the present invention may include a coupler 3510, a carrier amplifier 3520, a peaking amplifier 3530, and a Doherty combiner 3540. Since the coupler 3510, the carrier amplifier 3520, and the peaking amplifier 3530 are the same as the coupler 210, the carrier amplifier 220, and the peaking amplifier 230 illustrated in FIG. 2, a detailed description thereof is omitted.

The Doherty combiner 3540 according to the present invention may include a phase shift section 3541 connected to an output terminal $P_1$ of the carrier amplifier 3520, a matching section 3542 connected to an output terminal $P_3$ of the Doherty power amplifier 3500, and a bandwidth improvement section 3543 connected to an output terminal $P_2$ of the peaking amplifier 3530. In this case, the phase shift section 3541 may be constituted by the first lumped element and the first resonant circuit, the matching section 3542 may be constituted by the second lumped element and the second resonant circuit, and the bandwidth improvement section 3543 may be constituted by the serial resonant circuit and the parallel resonant circuit.

Unlike the Doherty combiner 3240 of FIG. 32 described above, in the Doherty combiner 3540 according to the present invention, a phase shift section 3541 may be implemented by adding the first resonant circuit to the first lumped element which is equivalent to the first transmission line. Further, the matching section 3542 may be implemented by adding the second resonant circuit to the second lumped element which is equivalent to the second transmission line.

The first and second resonant circuits are added to the first and second lumped elements to miniaturize the Doherty combiner 3540 and improve a magnitude balance of the Doherty combiner 3540. Further, even though the first and second resonant circuits are added to the first and second lumped elements, the Doherty combiner 3540 may have the same phase difference as the Doherty combiner 3240 of FIG. 32.

When frequency magnitude characteristics of the first and second resonant circuits are described, in the case of a lossless resonant circuit, a signal is transferred without a loss at the resonant frequency and the signal is reflected while deviating from the center frequency, and as a result, the loss occurs. By using such a point, it is possible to improve a magnitude characteristic balance in a frequency band in which the magnitude balance is lost by deviating from the center frequency.

The first lumped element and the first resonant circuit may perform a phase shift function for combining outputs of the carrier amplifier 3520 and the peaking amplifier 3530. In this case, when the type of first lumped element is a π type, the parallel resonant circuit may be added to the corresponding lumped element and when the type of first lumped element is a T type, the serial resonant circuit may be added to the corresponding lumped element.

As illustrated in FIGS. 36A to 36D, the first lumped element and the first resonant circuit may be constituted by any one of 'Low-pass π type LC circuit 3610+parallel resonant circuit 3620', 'High-pass π type LC circuit 3630+parallel resonant circuit 3640', low-pass T type LC circuit 3650+serial resonant circuit 3660', and 'High-pass T type LC circuit 3670+serial resonant circuit 3680'. In this case, the L and C values of the first lumped element may be different from the L and C values of the first resonant circuit.

The L/C value of the first resonant circuit may be obtained using one relational equation in which a product of L and C is determined by the resonant frequency and a relational equation determined according to a difference in magnitude balance at a frequency which is out of the center frequency.

The second lumped element and the second resonant circuit may serve to impedance-match the output of the Doherty power amplifier 3500. Similarly, as illustrated in FIGS. 36A to 36D, the second lumped element and the second resonant circuit may be constituted by any one of 'Low-pass π type LC circuit 3610+parallel resonant circuit 3620', 'High-pass π type LC circuit 3630+parallel resonant circuit 3640', 'Low-pass T type LC circuit 3650+serial resonant circuit 3660', and 'High-pass T type LC circuit 3670+serial resonant circuit 3680'. In this case, the L and C values of the second lumped element may be different from the L and C values of the second resonant circuit. Further, the L and C values of the second resonant circuit may be the same as the L and C values of the first resonant circuit.

As described above, since four types of circuits are available as the first lumped element and the first resonant circuit and four types of circuits are available as the second lumped element and the second resonant circuit, the Doherty combiner 3540 according to the embodiment may be implemented as a total of 16 types.

As illustrated in FIGS. 37A to 37D, when the 'first lumped element+first resonant circuit/second lumped element+second resonant circuit' are π-π type structures, the 'first lumped element+first resonant circuit/second lumped element+second resonant circuit' may be constituted by 'Low-Pass π type+parallel resonant circuit/Low-Pass π type+parallel resonant circuit', 'Low-Pass π type+parallel resonant circuit/High-Pass π type+parallel resonant circuit', 'High-Pass π type+parallel resonant circuit/Low-Pass π type+parallel resonant circuit', and 'High-Pass π type+parallel resonant circuit/High-Pass π type+parallel resonant circuit'.

Further, when the 'first lumped element+first resonant circuit/second lumped element+second resonant circuit' are T-T type structures, the 'first lumped element+first resonant circuit/second lumped element+second resonant circuit' may be constituted by 'Low-Pass T type+serial resonant circuit/Low-Pass T type+serial resonant circuit', 'Low-Pass T type+serial resonant circuit/High-Pass T type+serial resonant circuit', 'High-Pass T type+serial resonant circuit/Low-Pass T type+serial resonant circuit', and 'High-Pass T type+serial resonant circuit/High-Pass T type+serial resonant circuit'.

Further, when the 'first lumped element+first resonant circuit/second lumped element+second resonant circuit' are π-T type structures, the 'first lumped element+first resonant circuit/second lumped element+second resonant circuit' may be constituted by 'Low-Pass π type+parallel resonant circuit/Low-Pass T type+serial resonant circuit', 'Low-Pass π type+parallel resonant circuit/High-Pass T type+serial resonant circuit', 'High-Pass π type+parallel resonant circuit/Low-Pass T type+serial resonant circuit', and 'High-Pass π type+parallel resonant circuit/High-Pass T type+serial resonant circuit'.

Further, when the 'first lumped element+first resonant circuit/second lumped element+second resonant circuit' are T-π type structures, the 'first lumped element+first resonant circuit/second lumped element+second resonant circuit' may be constituted by 'Low-Pass T type+serial resonant circuit/Low-Pass π type+parallel resonant circuit', 'Low-Pass T type+serial resonant circuit/High-Pass π type+parallel resonant circuit', 'High-Pass T type+serial resonant circuit/Low-Pass π type+parallel resonant circuit', and 'High-Pass T type+serial resonant circuit/High-Pass π type+parallel resonant circuit'.

The serial resonant circuit of the bandwidth improvement section 3543 may be constituted by L/C passive elements for improving the phase bandwidth of the Doherty power amplifier 3500. The parallel resonant circuit of the bandwidth improvement section 3543 may be constituted by L/C passive elements for improving the magnitude bandwidth of the Doherty power amplifier 3500.

The Doherty combiner 3540 adds the serial resonant circuit to the output terminal $P_2$ of the peaking amplifier 3530 to improve the phase bandwidth of the Doherty power amplifier 3500. Further, the Doherty combiner 3540 adds the parallel resonant circuit to the output terminal $P_2$ of the peaking amplifier 3530 to improve the magnitude bandwidth of the Doherty power amplifier 3500.

Figure 38:
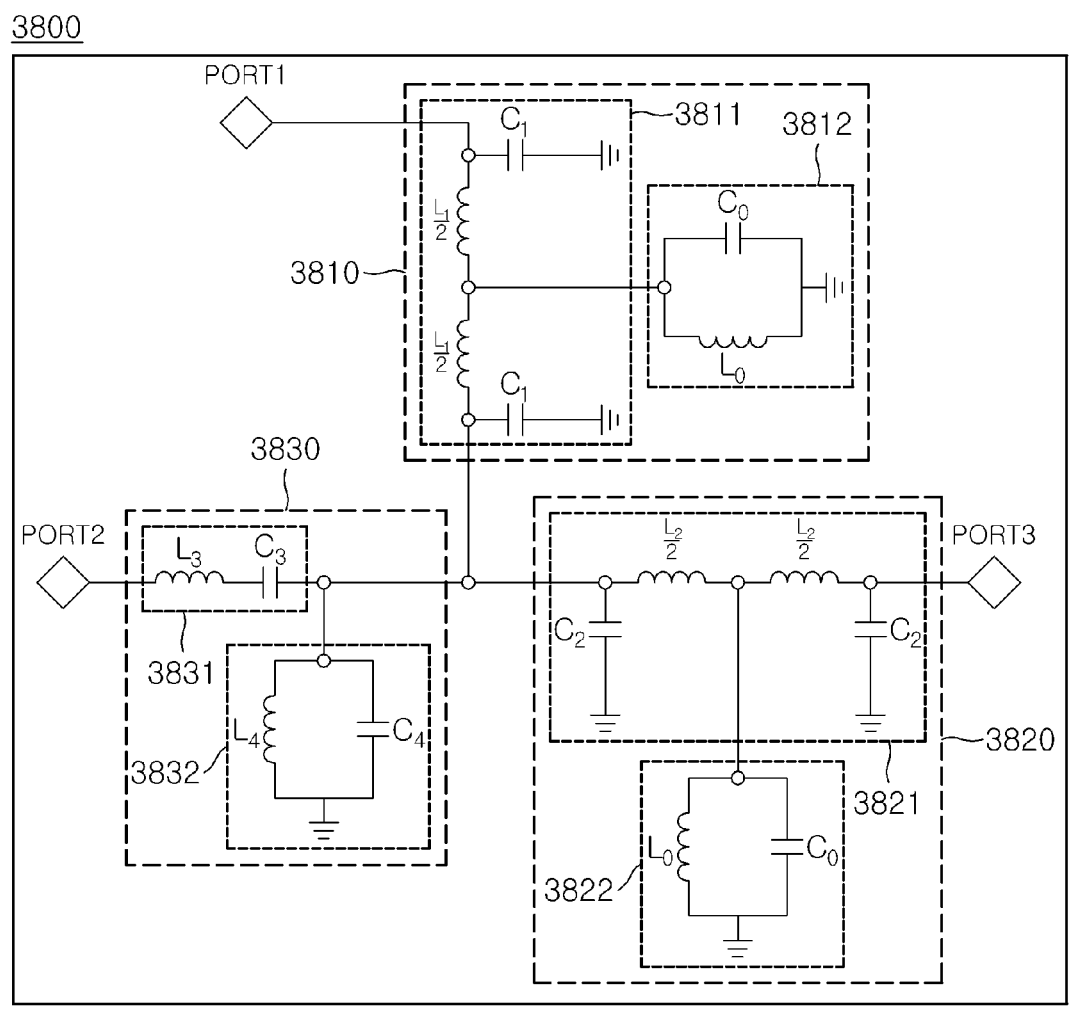
FIG. 38 is a diagram illustrating one example of a Doherty combiner having a structure in which first and second resonant circuits are added to first and second lumped elements.

FIG. 38 is a diagram illustrating one example of a Doherty combiner 3800 having a structure in which first and second resonant circuits are added to first and second lumped elements. Hereinafter, in the embodiment, a phase shift section 3810 of the Doherty combiner 3800 as a π type structure may be constituted by a 'Low-Pass π type+parallel resonant circuit'. A matching section 3820 of the Doherty combiner 3800 as a π type structure may be constituted by the 'Low-Pass π type+parallel resonant circuit'.

Referring to FIG. 38, the Doherty combiner 3800 may include a phase shift section 3810 constituted by a first lumped element 3811 and a first resonant circuit 3812, a matching section 3820 constituted by a second lumped element 3821 and a second resonant circuit 3822, and a bandwidth improvement section 3830 constituted by a serial resonant circuit 3831 and a parallel resonant circuit 3832.

The first lumped element 3811 may be configured by a Low-Pass π type constituted by two inductors $L_1/2$ and two capacitors $C_1$ and the first resonant circuit 3812 may be configured in a structure in which one inductor $L_0$ and one capacitor $C_0$ are connected in parallel.

The second lumped element 3821 may be configured by a Low-Pass π type constituted by two inductors $L_2/2$ and two capacitors $C_2$ and the second resonant circuit 3822 may be configured in a structure in which one inductor $L_0$ and one capacitor $C_0$ are connected in parallel. Here, the L and C values of the second resonant circuit 3822 may be the same as the L and C values of the first resonant circuit 3812.

The serial resonant circuit 3831 may be configured in a structure in which one inductor $L_3$ and one capacitor $C_3$ are connected in series and the parallel resonant circuit 3832 may be configured in a structure in which one inductor $L_4$ and one capacitor $C_4$ are connected in parallel.

The Doherty combiner 3840 adds the first and second resonant circuits 3812 and 3822 to the first and second lumped elements 3811 and 3821 to miniaturize a size of the corresponding combiner 3840 and improve a magnitude balance of the corresponding combiner 3840.

Figure 39A:
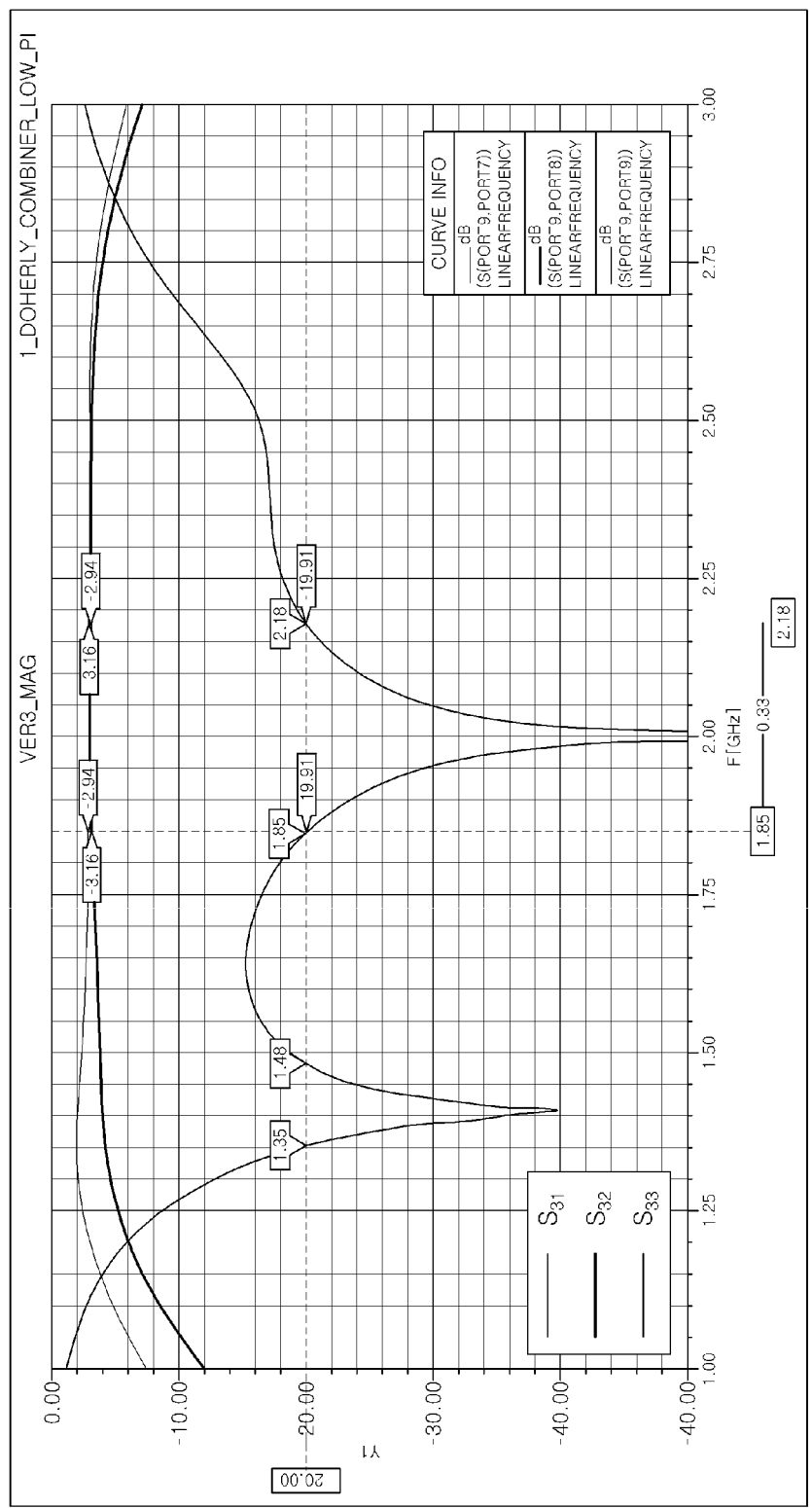
FIG. 39A is a diagram illustrating a result of simulating a magnitude characteristic of the Doherty combiner of FIG. 38.
Figure 39B:
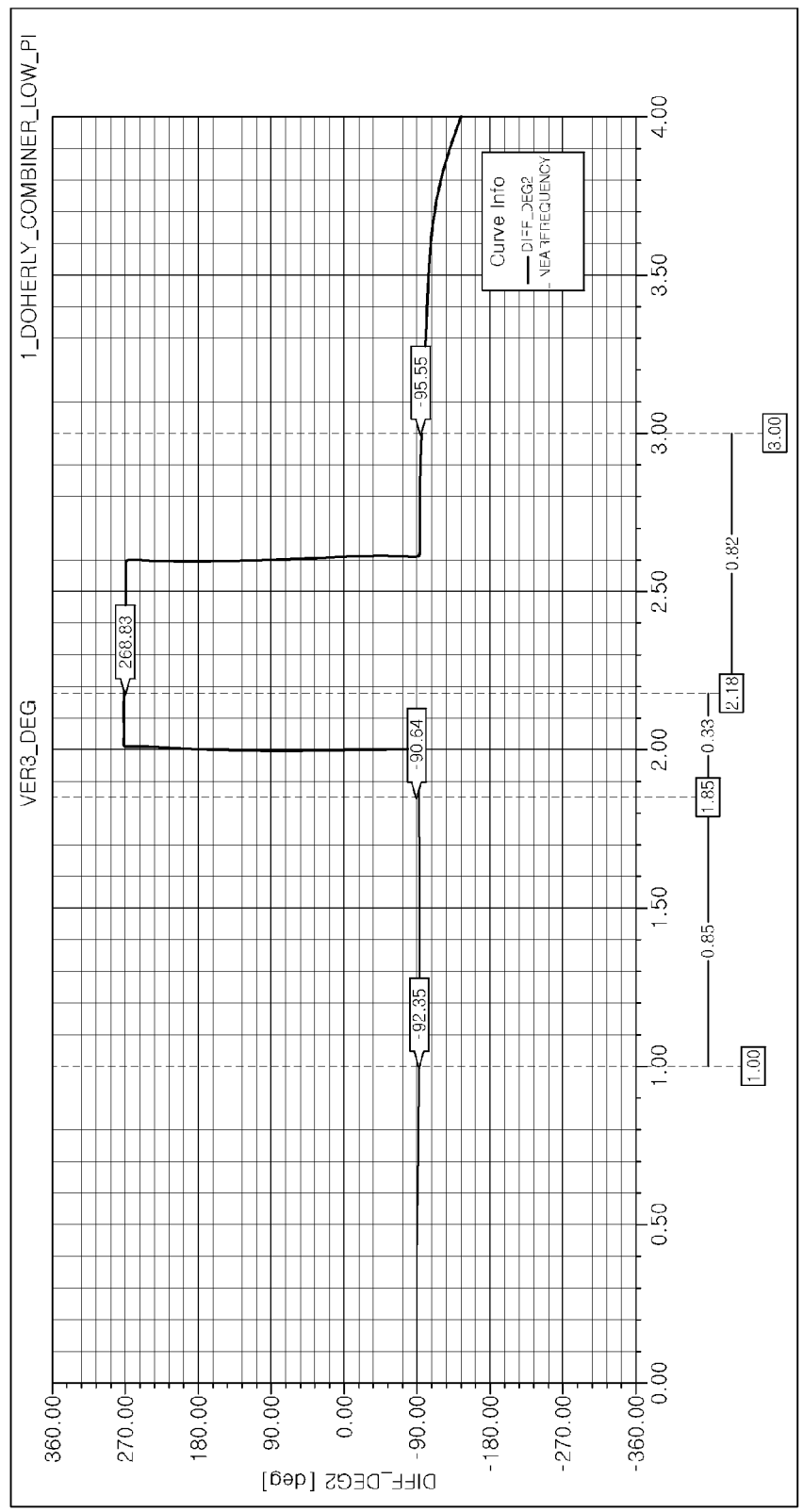
FIG. 39B is a diagram illustrating a result of simulating a phase difference characteristic of the Doherty combiner of FIG. 38.

FIG. 39A is a diagram illustrating a result of simulating the magnitude characteristic of the Doherty combiner of FIG. 38 and FIG. 39B is a diagram illustrating a result of simulating the phase difference characteristic of the Doherty combiner of FIG. 38.

In the simulation, the Doherty combiner according to the present invention is designed with a first lumped element of $L_1$=3.9789 nH and $C_1$=1.5915 pF, a second lumped element of $L_2$=2.8135 nH and $C_2$=2.2508 pF, a serial/parallel resonant circuit of $L_3$=5.7569 nH and $C_3$=1.1 pF, and a parallel resonant circuit of $L_0$=2.533 nH and $C_0$=2.5 pF.

As illustrated in FIG. 39A, it may be verified that in the case of the Doherty combiner according to the present invention, the magnitude bandwidth slightly decreases as compared with the Doherty combiner using only the lumped element, but the magnitude balance is significantly improved. Further, as illustrated in FIG. 39B, it may be verified that the Doherty combiner according to the present invention has the same phase difference as the Doherty combiner using only the lumped element.

In other words, it may be verified that the first and second resonant circuits are added to the first and second lumped elements provided in the Doherty combiner 3200 of FIG. 32 described above to improve the magnitude balance of the corresponding amplifier while maintaining the phase bandwidth of the Doherty power amplifier.

Eighth Embodiment

Figure 40:
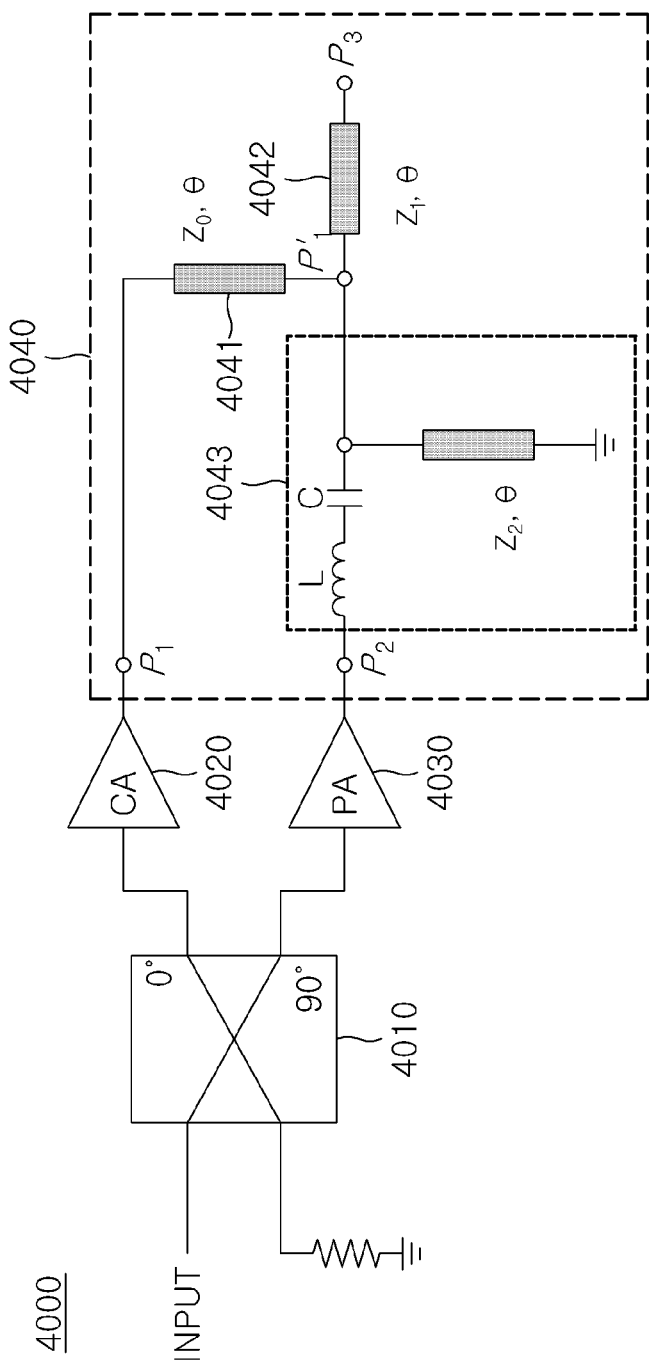
FIG. 40 is a diagram illustrating a configuration of a Doherty power amplifier according to an eighth embodiment of the present invention.

FIG. 40 is a diagram illustrating a configuration of a Doherty power amplifier according to an eighth embodiment of the present invention.

Referring to FIG. 40, a Doherty power amplifier 4000 according to an eighth embodiment of the present invention may include a coupler 4010, a carrier amplifier 4020, a peaking amplifier 4030, and a Doherty combiner 4040. Since the coupler 4010, the carrier amplifier 4020, and the peaking amplifier 4030 are the same as the coupler 210, the carrier amplifier 220, and the peaking amplifier 230 illustrated in FIG. 2, a detailed description thereof is omitted.

The Doherty combiner 4040 according to the present invention may include a phase shift section 4041 connected to an output terminal $P_1$ of the carrier amplifier 4040, a matching section 4042 connected to an output terminal $P_3$ of the Doherty power amplifier 4000, and a bandwidth improvement section 4043 connected to an output terminal $P_2$ of the peaking amplifier 4043.

The phase shift section 4041 may be constituted by a first transmission line or a first lumped element (not illustrated) equivalent to the first transmission line and the matching section 4042 may be constituted by a second transmission line or a second lumped element (not illustrated) equivalent to the second transmission line.

The bandwidth improvement section 4043 may be constituted by a serial resonant circuit and a parallel resonant circuit (not illustrated). Here, the parallel resonant circuit may be implemented by the short stub which is the equivalent circuit.

The first transmission line 4041 may be constituted by a 90° phase shift line for combining the outputs of the carrier amplifier 4020 and the peaking amplifier 4030. In this case, the first transmission line 4041 may have a characteristic impedance of $Z_0$ and an electrical length of $$\theta\left(=\frac{\pi}{2}\frac{f}{f_0}\right).$$

The second transmission line 4042 may be constituted by a transmission line for matching the output of the Doherty power amplifier 4000. In this case, the second transmission line 4042 may have a characteristic impedance of $Z_1$ and an electrical length of $$\theta\left(=\frac{\pi}{2}\frac{f}{f_0}\right).$$

The serial resonant circuit of the bandwidth improvement section 4043 may be constituted by L/C passive elements for improving the bandwidth of the Doherty power amplifier 4000. The short stub of the bandwidth improvement section 4043 may have a characteristic impedance of $Z_2$ and an electrical length of $$\theta\left(=\frac{\pi}{2}\frac{f}{f_0}\right).$$

Characteristic impedance values $Z_0$, $Z_1$, and $Z_2$ of the first transmission line 4041, the second transmission line 4042, and the short stub may be determined according to design specifications of the carrier amplifier and the peaking amplifier.

Even when impedances of first and second input ports $P_1$ and $P_2$ and an impedance of an output port $P_3$ are different from each other, the Doherty combiner 4040 according to the present invention may have the same phase bandwidth and magnitude bandwidth as the Doherty combiner 3040 of FIG. 30 described above.

Further, even when the impedance of the first input port $P_1$ and the impedance of the second input port $P_2$ are different from each other, the Doherty combiner 4040 according to the present invention may improve the phase bandwidth and the magnitude bandwidth while distributing the power according to an impedance ratio.

As such, the Doherty combiner 4040 adds the serial resonant circuit to the output terminal $P_2$ of the peaking amplifier 4030 to improve the phase bandwidth of the Doherty power amplifier 4000. Further, the Doherty combiner 4040 adds the parallel resonant circuit or the short stub to the output terminal $P_2$ of the peaking amplifier 4030 to improve the magnitude bandwidth of the Doherty power amplifier 4000.

Figure 41A:
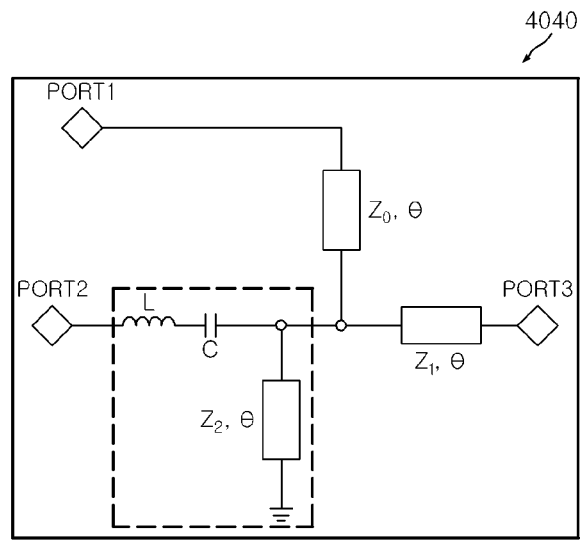
FIGS. 41A to 41C are diagrams illustrating a configuration of a Doherty combiner in which the lumped element illustrated in the Doherty combiner of FIG. 40 is converted into a dispersion element.
Figure 41B:
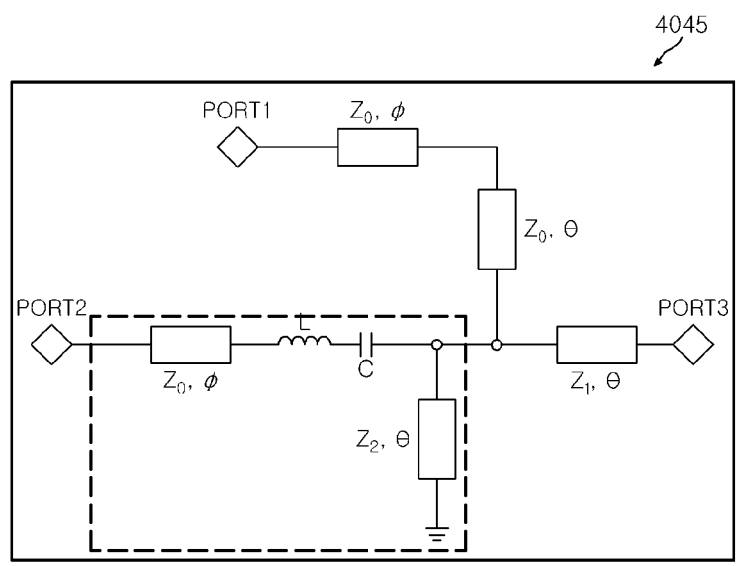
Figure 41C:
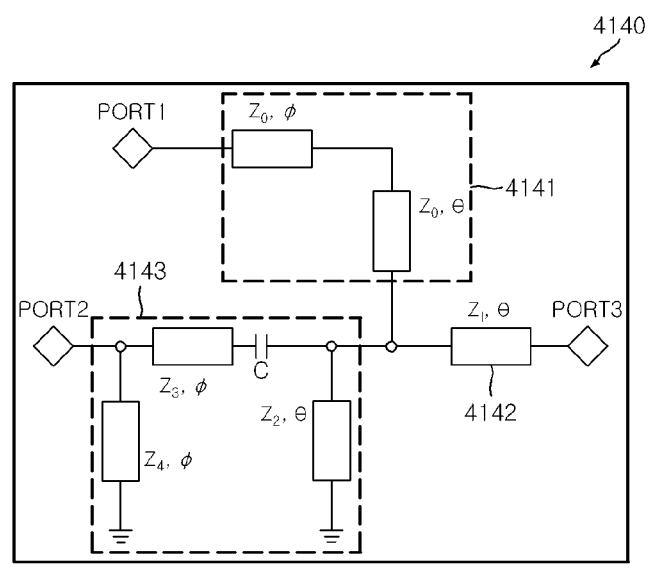
Figure 42A:
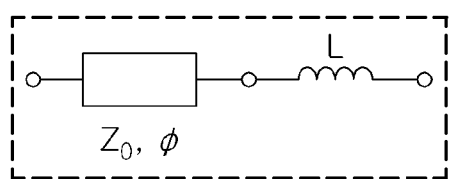
FIGS. 42A to 42D are diagrams referred to for describing a method for implementing an equivalent circuit using Kuroda's Identities.
Figure 42B:
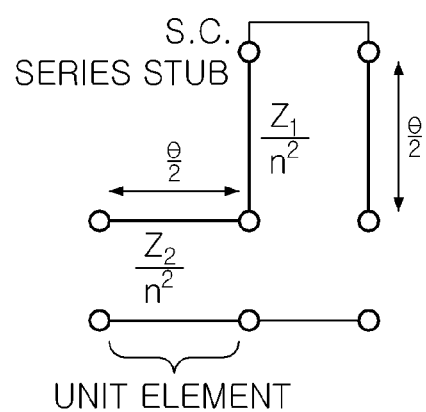
Figure 42C:
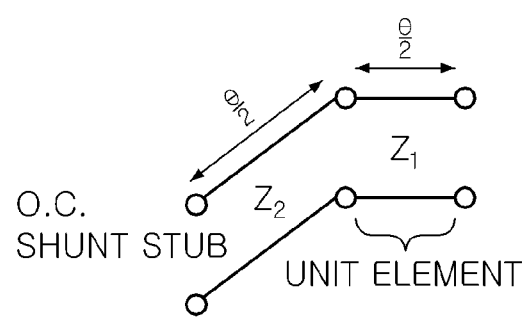
Figure 42D:
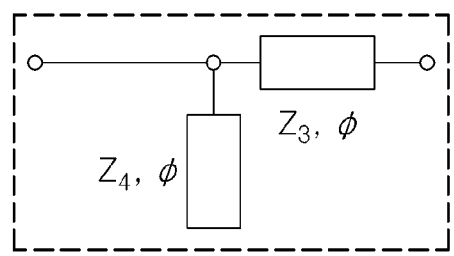

FIGS. 41A to 41C are diagrams illustrating a configuration of a Doherty combiner converting the lumped element illustrated in the Doherty combiner of FIG. 40 into the distributed element and FIGS. 42A to 42D are a diagram referred to for describing a method for implementing an equivalent circuit using Kuroda's Identities.

Referring to FIGS. 41A to 41C, a Doherty combiner 4140 may include a phase shift section 4141 connected to an output terminal $P_1$ of the carrier amplifier, a matching section 4142 connected to an output terminal $P_3$ of the Doherty power amplifier, and a bandwidth improvement section 4143 connected to an output terminal $P_2$ of the peaking amplifier.

The phase shift section 4141 may be constituted by the first transmission line and the second transmission line in order to combine the outputs of the carrier amplifier and the peaking amplifier. In this case, the first transmission line may have a characteristic impedance of $Z_0$ and an electrical length of Ø and the second transmission line may have the characteristic impedance of $Z_0$ and an electrical length of θ.

The matching section 4142 may be constituted by the third transmission line in order to match the output of the Doherty power amplifier. In this case, the third transmission line may have a characteristic impedance of $Z_1$ and the electrical length of θ.

The bandwidth improvement section 4143 may be constituted a fourth transmission line, a fifth transmission line, a capacitance, and the short stub in order to improve the phase bandwidth and/or the magnitude bandwidth. In this case, the fourth transmission line may have a characteristic impedance of $Z_3$ and the electrical length of Ø and the fifth transmission line may have a characteristic impedance of $Z_4$ and the electrical length of Ø.

As illustrated in FIGS. 41A and 41B, when L and C of the serial resonant circuit connected to the second input port $P_2$ are constituted by the distributed elements other than the lumped elements, a length is added in L and C, and as a result, a transmission line having $Z_0$ and θ/2 corresponding thereto should be added to an first input port $P_1$. In order to solve the addition problem, the equivalent circuit may be implemented using the Kuroda's Identities.

For example, as illustrated in FIGS. 42A to 42D, the inductor L and additional transmission lines may be implemented by two transmission lines by using known Kuroda's Identities. As a result, the distributed element equivalent to the lumped element of the serial resonant circuit may be implemented at the output terminal of the peaking amplifier. In this case, the distributed element may include the fourth transmission line, the fifth transmission line, and the capacitor.

Even when the impedance of the input port and the impedance of the output port are different from each other, the Doherty combiner 4140 according to the present invention may have the same phase bandwidth and magnitude bandwidth as the Doherty combiner 3040 of FIG. 30 described above.

As such, the Doherty combiner 4140 adds the distributed element implemented by using the Kuroda's Identities to the output terminal $P_2$ of the peaking amplifier to improve the phase bandwidth of the Doherty power amplifier. Further, the Doherty combiner 4140 adds the parallel resonant circuit or the short stub to the output terminal $P_2$ of the peaking amplifier to improve the magnitude bandwidth of the Doherty power amplifier.

Effects of a Doherty combiner according to embodiments of the present invention will be described below.

According to at least one of embodiments of the present invention, a transmission line is added to an output terminal of a peaking amplifier to improve a phase bandwidth and/or a magnitude bandwidth of a Doherty power amplifier.

Further, according to at least one of embodiments of the present invention, one or more resonant circuits are added to the output terminal of the peaking amplifier to improve the phase bandwidth and/or the magnitude bandwidth of the Doherty power amplifier.

However, effects which can be achieved by the Doherty combiner according to embodiments of the present invention are not limited to the aforementioned effects and other unmentioned effects will be clearly understood by those skilled in the art from the following description.

Meanwhile, although the detailed embodiments of the present invention have been described hereinabove, various modifications of the present invention can be made without departing from the scope of the present invention. Therefore, the scope of the present invention is not limited to the embodiments and should be defined by the appended claims and equivalents to the appended claims.

What is claimed is:

1. A Doherty combiner comprising:
a phase shift section connected between one end of a carrier amplifier and a common node so as to change a phase of an RF signal output from the carrier amplifier;
a matching section connected between the common node and an output terminal of a Doherty power amplifier so as to impedance-match an output of the Doherty power amplifier; and
a bandwidth improvement section connected between one end of a peaking amplifier and the common node so as to change at least one of a phase bandwidth and a magnitude bandwidth of the Doherty power amplifier,
wherein the common node indicates one point where one end of the phase shift section, one end of the matching section, and one end of the bandwidth improvement section meet one another.

2. The Doherty combiner of claim 1, wherein the bandwidth improvement section includes a 180° phase shift line.

3. The Doherty combiner of claim 1, wherein the bandwidth improvement section includes a 180° phase shift line connected to one end of the peaking amplifier and a parallel resonant circuit connected to the 180° phase shift line.

4. The Doherty combiner of claim 1, wherein the bandwidth improvement section includes a 180° phase shift line connected to one end of the peaking amplifier and a short stub connected to the 180° phase shift line.

5. The Doherty combiner of claim 1, wherein the bandwidth improvement section includes a serial resonant circuit in which an inductor L and a capacitor C are connected in series.

6. The Doherty combiner of claim 1, wherein the bandwidth improvement section includes a serial resonant circuit in which a first inductor and a first capacitor are connected in series and a parallel resonant circuit in which a second inductor and a second capacitor are connected in parallel.

7. The Doherty combiner of claim 5, wherein the phase shift section includes a first transmission line for combining outputs of the carrier amplifier and the peaking amplifier, and
the matching section includes a second transmission line for impedance-matching the output of the Doherty power amplifier.

8. The Doherty combiner of claim 5, wherein the phase shift section includes first lumped elements having an equivalent relationship to a transmission line for combining the outputs of the carrier amplifier and the peaking amplifier, and
the matching section includes a second lumped element having an equivalent relationship to a transmission line for impedance-matching the output of the Doherty power amplifier.

9. The Doherty combiner of claim 8, wherein the first lumped element is configured by any one of a Low-Pass π Type LC circuit, a High-Pass π Type LC circuit, a Low-Pass T Type LC circuit, and a High-Pass T Type LC circuit, and
the second lumped element is configured by any one of a Low-Pass π Type LC circuit, a High-Pass π Type LC circuit, a Low-Pass T Type LC circuit, and a High-Pass T Type LC circuit.

10. The Doherty combiner of claim 9, wherein the second lumped element has a different L/C value from the first lumped element.

11. The Doherty combiner of claim 5, wherein the phase shift section includes a first lumped element and a first resonant circuit having the equivalent relationship to the transmission line for combining the outputs of the carrier amplifier and the peaking amplifier, and
the matching section includes a second lumped element and a second resonant circuit having the equivalent relationship to the transmission line for impedance-matching the output of the Doherty power amplifier.

12. The Doherty combiner of claim 11, wherein when the first or second lumped element is a π type structure, the first or second resonant circuit is the parallel resonant circuit, and
when the first or second lumped element is a T type structure, the first or second resonant circuit is the serial resonant circuit.

13. The Doherty combiner of claim 11, wherein the second resonant circuit has the same L/C value as the first resonant circuit.

14. The Doherty combiner of claim 1, wherein the bandwidth improvement section includes a serial resonant circuit in which the inductor and the capacitor are connected in series and a short stub connected to the serial resonant circuit.

15. The Doherty combiner of claim 1, wherein the bandwidth improvement section includes a distributed element circuit having the equivalent relationship to a lumped element circuit corresponding to the serial resonant circuit.

16. The Doherty combiner of claim 15, wherein the distributed element circuit includes two transmission lines and capacitors equally substituted by Kuroda's Identities.

17. The Doherty combiner of claim 6, wherein the phase shift section includes a first transmission line for combining outputs of the carrier amplifier and the peaking amplifier, and
the matching section includes a second transmission line for impedance-matching the output of the Doherty power amplifier.

18. The Doherty combiner of claim 6, wherein the phase shift section includes first lumped elements having an equivalent relationship to a transmission line for combining the outputs of the carrier amplifier and the peaking amplifier, and
the matching section includes a second lumped element having an equivalent relationship to a transmission line for impedance-matching the output of the Doherty power amplifier.

19. The Doherty combiner of claim 6, wherein the phase shift section includes a first lumped element and a first resonant circuit having the equivalent relationship to the transmission line for combining the outputs of the carrier amplifier and the peaking amplifier, and
the matching section includes a second lumped element and a second resonant circuit having the equivalent relationship to the transmission line for impedance-matching the output of the Doherty power amplifier.

* * * * *